(12) United States Patent
Kusukame et al.

(10) Patent No.: US 8,699,123 B2
(45) Date of Patent: Apr. 15, 2014

(54) WAVELENGTH CONVERSION LASER LIGHT SOURCE AND IMAGE DISPLAY APPARATUS

(75) Inventors: Koichi Kusukame, Osaka (JP); Tetsuro Mizushima, Hyogo (JP); Nobuyuki Horikawa, Kyoto (JP); Hiroyuki Furuya, Osaka (JP); Tomoya Sugita, Nara (JP); Shinichi Kadowaki, Kumamoto (JP)

(73) Assignee: Panasonic Corporation, Osaka (JP)

( * ) Notice: Subject to any disclaimer, the term of this patent is extended or adjusted under 35 U.S.C. 154(b) by 539 days.

(21) Appl. No.: 13/139,586

(22) PCT Filed: Oct. 19, 2010

(86) PCT No.: PCT/JP2010/006185
§ 371 (c)(1),
(2), (4) Date: Jun. 14, 2011

(87) PCT Pub. No.: WO2011/048795
PCT Pub. Date: Apr. 28, 2011

(65) Prior Publication Data
US 2011/0255149 A1    Oct. 20, 2011

(30) Foreign Application Priority Data

Oct. 21, 2009 (JP) .................................. 2009-242008
Mar. 17, 2010 (JP) .................................. 2010-060586

(51) Int. Cl.
| G02F 1/35 | (2006.01) |
| H01S 3/10 | (2006.01) |
| H01S 3/109 | (2006.01) |
| H01S 5/00 | (2006.01) |
| G02F 1/355 | (2006.01) |
| G02F 1/377 | (2006.01) |
| G02F 1/37 | (2006.01) |

(52) U.S. Cl.
CPC ............... *H01S 3/109* (2013.01); *H01S 5/0092* (2013.01); *G02F 1/3558* (2013.01); *G02F 1/3775* (2013.01); *G02F 1/37* (2013.01)
USPC ................ 359/326; 359/328; 372/21; 372/22

(58) Field of Classification Search
None
See application file for complete search history.

(56) References Cited

U.S. PATENT DOCUMENTS

| 5,357,533 A | 10/1994 | Mizuuchi et al. |
| 6,175,578 B1 * | 1/2001 | Ito ................................... 372/10 |
| 6,711,183 B1 | 3/2004 | Mizuuchi et al. |
| 6,944,194 B1 * | 9/2005 | Hatori et al. .................... 372/21 |

(Continued)

FOREIGN PATENT DOCUMENTS

| JP | 5-273623 | 10/1993 |
| JP | 2000-321610 | 11/2000 |

(Continued)

OTHER PUBLICATIONS

International Search Report issued Dec. 28, 2010 in International (PCT) Application No. PCT/JP2010/006185.

(Continued)

*Primary Examiner* — Hemang Sanghavi
(74) *Attorney, Agent, or Firm* — Wenderoth, Lind & Ponack, L.L.P.

(57) ABSTRACT

A wavelength conversion laser light source 100 has: a laser light source configured to generate fundamental wave laser light; and a wavelength conversion element 101 provided with a periodic polarization reversal structure configured to convert the fundamental wave laser light which is incident onto the periodic polarization reversal structure into different laser light in wavelength wherein the wavelength conversion element includes different polarization reversal regions in period; and a polarization reversal axis 102 of at least one of the polarization reversal regions is inclined with respect to an incident optical path of the fundamental wave laser light on the wavelength conversion element.

20 Claims, 34 Drawing Sheets

(56) References Cited

U.S. PATENT DOCUMENTS

| | | |
|---|---|---|
| 7,742,221 B2 | 6/2010 | Mizuuchi et al. |
| 7,769,060 B1 | 8/2010 | Furuya et al. |
| 7,907,646 B2 | 3/2011 | Mizuuchi et al. |
| 2007/0121685 A1 | 5/2007 | Maekawa |
| 2007/0133628 A1* | 6/2007 | Komatsu et al. ............... 372/21 |
| 2009/0040596 A1* | 2/2009 | Mizuuchi et al. ............ 359/328 |
| 2010/0085631 A1 | 4/2010 | Kusukame et al. |
| 2010/0103088 A1 | 4/2010 | Yokoyama et al. |
| 2010/0150186 A1 | 6/2010 | Mizuuchi et al. |

FOREIGN PATENT DOCUMENTS

| | | |
|---|---|---|
| JP | 2006-106804 | 4/2006 |
| JP | 2007-173769 | 7/2007 |
| JP | 2007-233371 | 9/2007 |
| JP | 2008-140919 | 6/2008 |
| WO | 2006/112303 | 10/2006 |
| WO | 2007/013608 | 2/2007 |
| WO | 2007/032402 | 3/2007 |
| WO | 2008/093545 | 8/2008 |
| WO | 2008/114512 | 9/2008 |

OTHER PUBLICATIONS

Amirhossein Tehranchi et al., "Design of Novel Unapodized and Apodized Step-Chirped Quasi-Phase Matched Gratings for Broadband Frequency Converters Based on Second-Harmonic Generation", Journal of Lightwave Technology, vol. 26, No. 3, Feb. 1, 2008.

* cited by examiner

WAVELENGTH CONVERSION LASER LIGHT SOURCE AND IMAGE DISPLAY APPARATUS

TECHNICAL FIELD

The present invention relates to a laser light source provided with a wavelength conversion element and an image display apparatus with the laser light source.

BACKGROUND ART

Visible-light laser light sources with monochromaticity high enough to output W-class of high power with three colors such as RGB have broader color reproducibility. Therefore the laser light sources are important for realizing large-screen displays with low power consumption, and compact and brighter illumination apparatuses.

Red-light and blue-light high-power laser light sources has been realized using semiconductor lasers. However it has not been practical to realize a green-light high power laser light source because there are difficulties in practically obtaining optimal materials to fabricate the green-light high power laser light source as a semiconductor laser. Therefore it has been an attractive method to use infrared light as fundamental wave, for example, from a semiconductor laser, fiber laser, or another device to generate green light as the second harmonic wave of the infrared light with a wavelength conversion element including nonlinear optical crystals.

However, speckle noise occurs if a laser is used as a light source of an image display apparatus. For example, light from various regions on the screen overlaps to form an image on the retina of the viewer viewing a virtual image formed by the projector. Meanwhile light beams passing through different regions on the screen overlap in a complex phase relationship interferes because laser light is highly coherent. Such interference results in interference patterns which become unintended optical intensity distributions (speckle noise) to degrade quality of the displayed image.

Speckle noise is a common issue among image display apparatuses, measurement apparatuses, exposure apparatuses and alike in which coherent laser light is used as a light source. Therefore there have been various attempts to reduce speckle noise so far.

For example, Patent Document 1 proposes use of a rotating diffusion plate. According to the disclosed configuration, a diffusion plate operable to rotate at high speed is positioned in an optical path of laser light emitted from a light source. The diffusion plate is rotated at high speed to move the interference pattern generated by the laser light on the screen, so that the interference patterns are averaged to reduce the speckle noise.

In deed, according to the aforementioned configuration, the interference patterns do not disappear but the speckle noise looks disappeared because of the superposition of mutually uncorrelated different interference patterns.

However, in this case, it is also difficult to make speckle noise disappear completely. In particular, prominent speckle noise remains in green light generated by a wavelength conversion element. This results from limited wavelength to be converted to green light in the wavelength conversion element, which in turn leads to narrower wavelength range and more coherent than the red and blue colors from a semiconductor laser.

FIG. 2 shows a schematic configuration of a conventionally used general laser light source 200 conventionally used to generate fundamental wave 203 with a fundamental wave light source 201 and make it incident on a wavelength conversion element 202. The wavelength conversion element 202 converts the fundamental wave light 203 generated in the fundamental wave light source 201 into the second harmonic wave 204. Nonlinear optical crystals, which are lithium niobate-based or lithium tantalite-based, are broadly used as a wavelength conversion element because such optical crystals have larger nonlinear optical constants and are capable of achieving more efficient wavelength conversion. A quasi-phase matched wavelength conversion element in which the polarization direction is reversed with a constant period ($\Lambda$) may be formed by using these nonlinear optical crystals to achieve more efficient wavelength conversion.

However, such high wavelength conversion efficiency has not been achieved for all wavelengths of the fundamental wave because the wavelength conversion efficiency depends on the wavelength of the fundamental wave. If the interaction length between the wavelength conversion element 202 and the infrared light as the fundamental wave (in the example of FIG. 2, the total length (L) of the wavelength conversion element 202 is the interaction length) is shortened, wavelength allowance range (range of wavelengths which may be more efficiently wavelength-converted) becomes broader whereas the wavelength conversion efficiency (the efficiency of wavelength conversion of the fundamental wave in the wavelength allowance range) goes down. In short, there is a tradeoff between the wavelength allowance range and the wavelength conversion efficiency.

For this issue, Non-patent Document 1 indicates a method for forming different polarization reversal regions in period in a wavelength conversion element to achieve both the broader wavelength allowance range and more efficient wavelength conversion. As shown in FIG. 3, a wavelength conversion laser light source 300 according to this method comprises a wavelength conversion element 301. The wavelength conversion element 301 comprises polarization reversal regions A1, A2, ..., An of which polarization reversal periods and lengths are set to $\Lambda 1, \Lambda 2, \ldots, \Lambda n$ and L1, L2, ..., Ln, respectively. It should be noted that the polarization reversal period $\Lambda i$ ($i=1, 2, \ldots, n$) of each region is expressed by $\Lambda i = \Lambda 1 + \Delta\Lambda(i-1)$. Therefore the polarization reversal periods of the polarization reversal regions monotonically increase or decrease from the surface onto which the fundamental wave is incident to the surface from which the wavelength-converted light is emitted.

Conversion from infrared light into green light, which is the second harmonic wave of the infrared light, using a lithium niobate-based wavelength conversion element is exemplified. The fundamental wave light source is an infrared light source configured to simultaneously emit a broader wavelength range of light from 1060 nm to 1064 nm in wavelength, as indicated by the spectral distribution of FIG. 17.

The optimum polarization reversal period of the lithium niobate-based wavelength conversion element to convert fundamental wave of wavelength 1060 nm into light of wavelength 530 nm as the second harmonic wave is 6.91 μm whereas the optimum polarization reversal period for conversion from fundamental wave of wavelength 1064 nm into light of wavelength 532 nm is 6.95 μm.

Thus by making $\Lambda 1 = 6.91$ μm and $\Lambda n = 6.95$ μm, and adjusting the optimum $\Delta\Lambda$ and length of each polarization reversal region in accordance with the total length of the element, the wavelength conversion element may achieve conversion of fundamental waves at all wavelengths from 1060 nm to 1064 nm into the second harmonic waves, respectively.

In FIG. 3, the same symbols are assigned to the same constituent elements in FIG. 2. Similarly, in this Description hereinafter, the same symbols are assigned to the same constituent elements, of which descriptions may be omitted.

Patent Document 1: Japanese Patent Application Laid-open No. 2007-233371

Non-patent Document 1: Journal of Lightwave Technology, Vol. 26, No. 3, Feb. 1, 2008

SUMMARY OF THE INVENTION

However, the above configuration of the conventional wavelength conversion laser light source has other issues such as fluctuation in output of wavelength-converted light even under constant fundamental wave output.

An object of the present invention is to provide a wavelength conversion laser light source with stable output, and an image display apparatus using the light source.

The wavelength conversion laser light source according to one aspect of the present invention has: a laser light source configured to generate fundamental wave laser light; and a wavelength conversion element provided with a periodic polarization reversal structure configured to convert the fundamental wave laser light which is incident onto the periodic polarization reversal structure into different laser light in wavelength, wherein the wavelength conversion element includes different polarization reversal regions in period; and a polarization reversal axis of at least one of the polarization reversal regions is inclined with respect to an incident optical path of the fundamental wave laser light on the wavelength conversion element.

According to the above configuration, it is likely that formation of the periodic polarization reversal structure inclined with respect to the optical path of the fundamental wave laser prevents "reconversion" in which laser light converted from the fundamental wave laser light and generated in the wavelength conversion element (the second harmonic wave or other wavelength-converted light) is again returned to the fundamental wave laser light. As a result, it is less likely that the wavelength conversion efficiency goes down.

A wavelength conversion laser light source according to the present invention is less likely to cause reduction in wavelength conversion efficiency, which results from "reconversion" as described above, so that the output effectively becomes more stable. Therefore if the wavelength conversion laser light source according to the present invention is used to display an image, the brightness of the image becomes more stable.

Objects, features and advantages of the present invention will be made clearer by the following detailed description and the attached drawings.

DETAILED DESCRIPTION OF THE INVENTION

As a result of our own studies about causes to make output of wavelength conversion unstable in a wavelength conversion element comprising several polarization reversal regions, we reached the following insights.

Wavelength conversion in a wavelength conversion element 301 from infrared light as the fundamental wave, which has a broader wavelength range such as 1060 nm to 1064 nm as aforementioned, to the second harmonic wave is exemplified.

First, a polarization reversal region A1 with $\Lambda 1=6.91$ μm converts an infrared light component of wavelength near 1060 nm into the second harmonic wave (green light) with wavelength near 530 nm. An infrared light component with wavelength near 1064 nm is then converted into green light with wavelength near 532 nm, in the polarization reversal region An with $\Lambda n=6.95$ μm. Meanwhile the green light with wavelength 530 nm generated as the second harmonic wave of the infrared light with wavelength 1060 nm, however, generates difference frequency waves with other infrared light than wavelength 1060 nm in the polarization reversal region An. For example, infrared light with wavelength 1056 nm is generated as the difference frequency wave between the green light with wavelength 530 nm and the infrared light with wavelength 1064 nm while infrared light with wavelength 1058 nm is also generated as the difference frequency wave between the green light with wavelength 530 nm and infrared light with wavelength 1062 nm.

Thus, the phenomena in which the second harmonic wave resulting from the wavelength conversion is reconverted into the fundamental wave as the difference frequency wave from the original fundamental wave leads to reduced wavelength conversion efficiency. Further, an amount of the reduction in the wavelength conversion efficiency due to the difference frequency wave generation greatly depends on temperature. Therefore increase in a change rate of the wavelength conversion efficiency due to the temperature change makes the output unstable.

If there are several different polarization reversal regions in period in the wavelength conversion element, such a problem occurs.

It should be noted that even under absence of the different polarization reversal regions in period from a wavelength conversion element, as described below, if an optical path of the second harmonic wave coincides with an optical path of the fundamental wave in an internal resonator-type wavelength conversion laser light source including a solid-state crystal laser and wavelength conversion element, a similar problem may happen. This is described in the context of Embodiment 2 hereinafter.

One embodiment according to the present invention to moderate the aforementioned phenomena and deliver stable output is described hereinafter with reference to the drawings.

(Embodiment 1)

Figure 1:
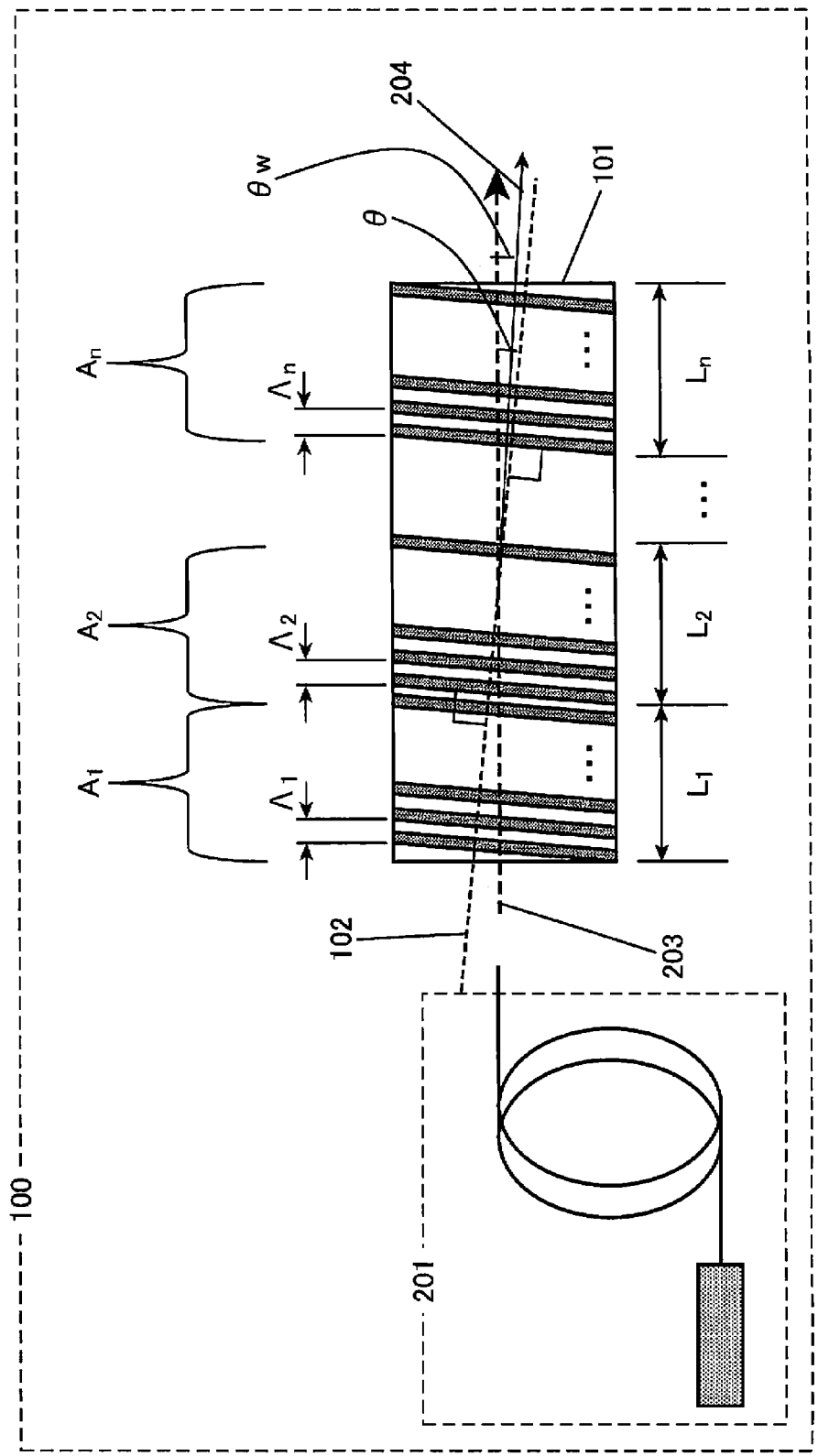
FIG. 1 shows schematic configuration of a wavelength conversion laser light source according to Embodiment 1 of the present invention.
Figure 2:
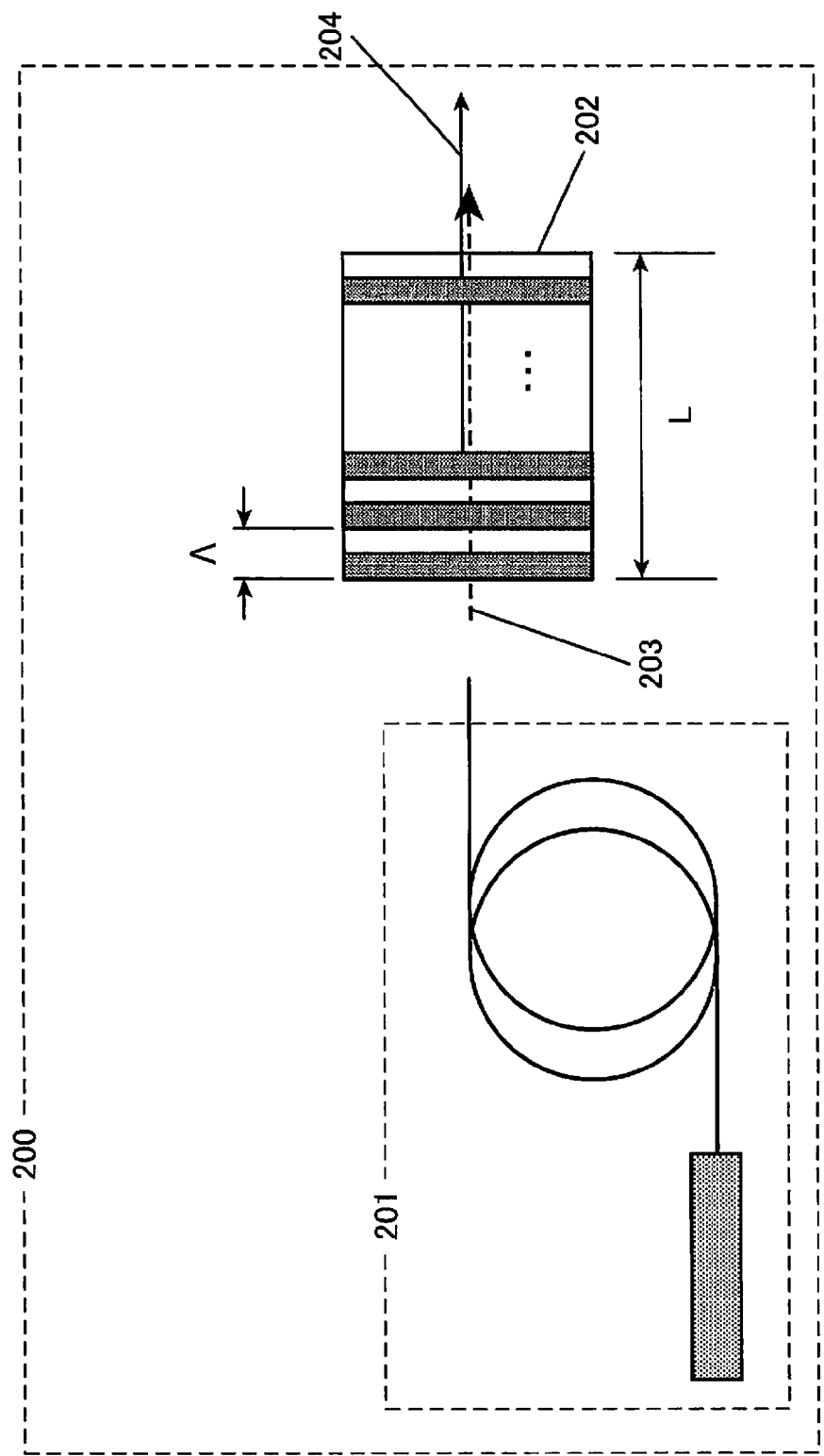
FIG. 2 shows schematic configuration of a conventional wavelength conversion laser light source.

FIG. 1 shows schematic configuration of a wavelength conversion laser light source 100 according to Embodiment 1 of the present invention. Like the prior art, the wavelength conversion laser light source 100 is configured to convert the fundamental wave generated by the fundamental wave light source 201 into the second harmonic wave. In addition, a wavelength conversion element 101 used in the present embodiment, like the wavelength conversion element 301, comprises several different polarization reversal regions in period. However it should be noted that the wavelength conversion element 101 is different from the wavelength conversion element 301 in terms of inclined configuration of the wavelength conversion element 101 with respect to an optical axis of the fundamental wave 203. A perpendicular line to the periodic polarization reversal structure is defined as a polarization reversal axis 102. An angle between the polarization reversal axis 102 and the optical axis of the fundamental wave 203 is defined as the polarization reversal angle θ. If θ does not equal to 0, a walkoff angle θw results from diffusion characteristics of the fundamental wave and the second harmonic wave. Meanwhile the harmonic wave is generated in a different propagation direction from the fundamental wave. It should be noted that the angles made by the polarization reversal axes of the polarization reversal regions are all equivalent. However a polarization reversal axis of at least one polarization reversal region is inclined with respect to the incident direction of the laser light results in the advantageous result of the present invention so that the phenomena of the reconversion to the fundamental wave as the difference frequency wave with the original fundamental wave may be moderated.

A larger walkoff angle results in more moderated reconversion and more output of the second harmonic wave whereas shorter interaction length between the fundamental wave and the second harmonic wave may result in apparent decline of the efficiency after the output of the second harmonic wave reaches a certain magnitude or greater. Therefore the larger walkoff angle may decrease the output of the second harmonic wave.

Figure 13:
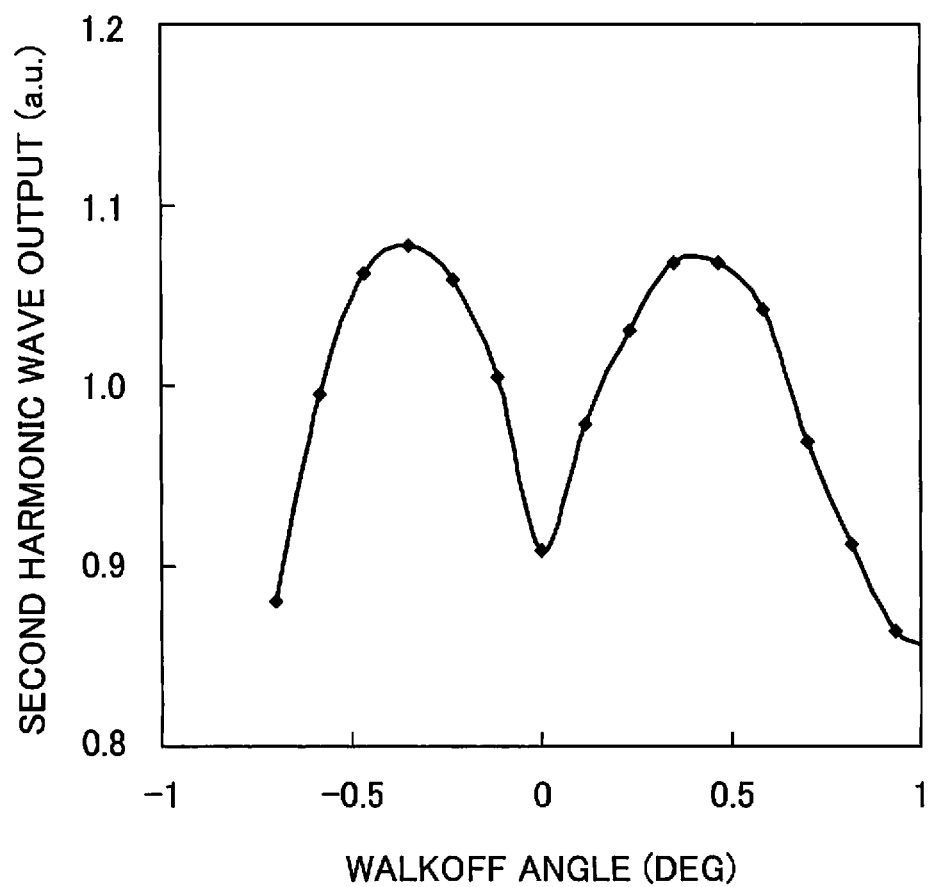
FIG. 13 shows a relationship between walkoff angle and second harmonic wave output in the wavelength conversion laser light source according to the present invention.

Thus it is preferable that an absolute value of the walkoff angle may be set to 0.1° or greater and 0.5° or less as shown in the experimental results of FIG. 13. In this range, a higher output of the second harmonic wave is obtained than when the walkoff angle is 0. In addition, it is preferable that a polarization reversal angle of a lithium niobate-based wavelength conversion element is particularly 2.9° or greater and 14.6° or less because this range is equivalent to the aforementioned range. Similarly, it is preferable that a polarization reversal angle of a lithium tantalite-based wavelength conversion element is 3.3° or greater and 16.6° or less because this range is equivalent to the aforementioned range.

Figure 4:
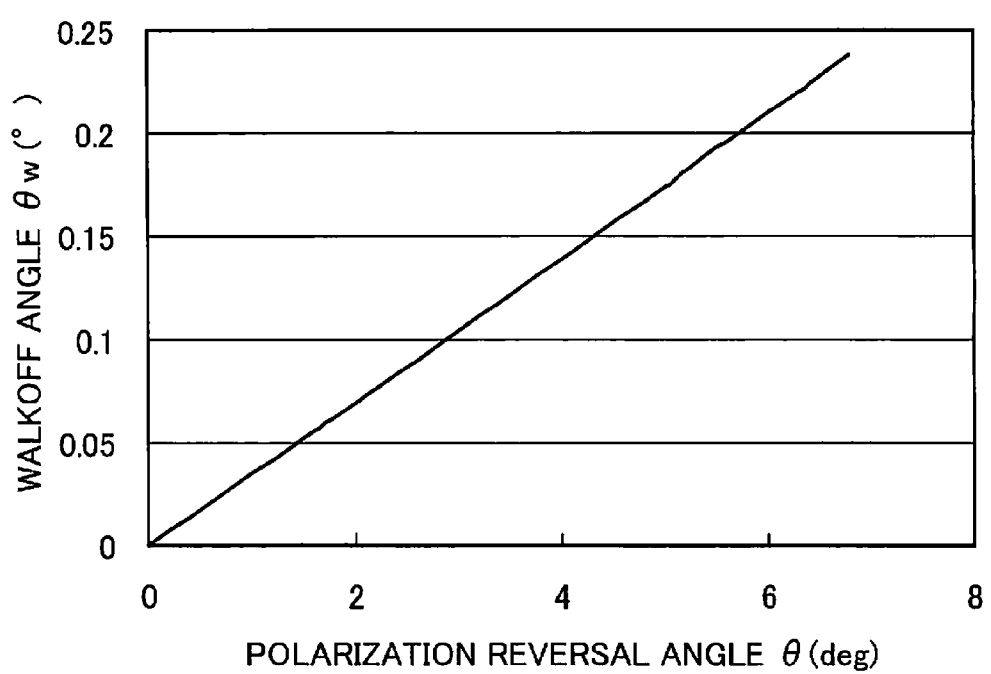
FIG. 4 shows a relationship between polarization reversal angle and walkoff angle in a wavelength conversion element of the wavelength conversion laser light source according to the present invention.

FIG. 4 shows a relationship between the polarization reversal angle $\theta$ and the walkoff angle $\theta w$ when the wavelength conversion element of lithium niobate is used to convert infrared light as the fundamental into green light as the second harmonic wave.

The larger polarization reversal angle $\theta$ results in the larger walkoff angle $\theta w$, which decreases an overlap between the generated second harmonic and the fundamental wave. Therefore, for example, it is likely that the reconversion into the fundamental wave from the second harmonic wave generated by the polarization reversal region A1 in the subsequent polarization reversal regions A2 to An decreases.

In addition, if a polarization reversal axis of at least one of polarization reversal regions is different from a polarization reversal axis of at least another among the other polarization reversal regions, instability of the output resulting from the reconversion may effectively suppressed.

Figure 5:
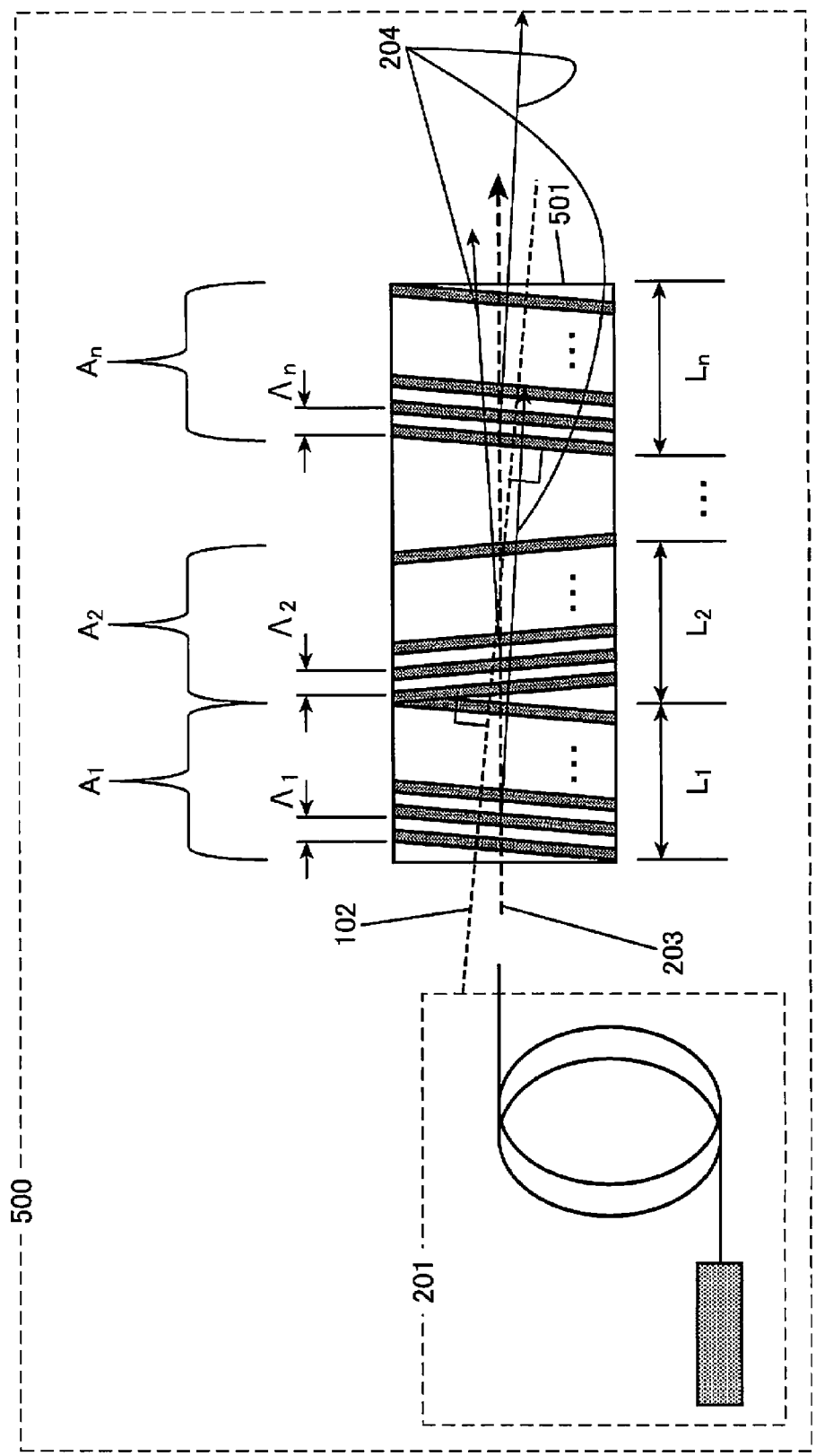
FIG. 5 shows schematic configuration of another wavelength conversion laser light source according to Embodiment 1 of the present invention.
Figure 6:
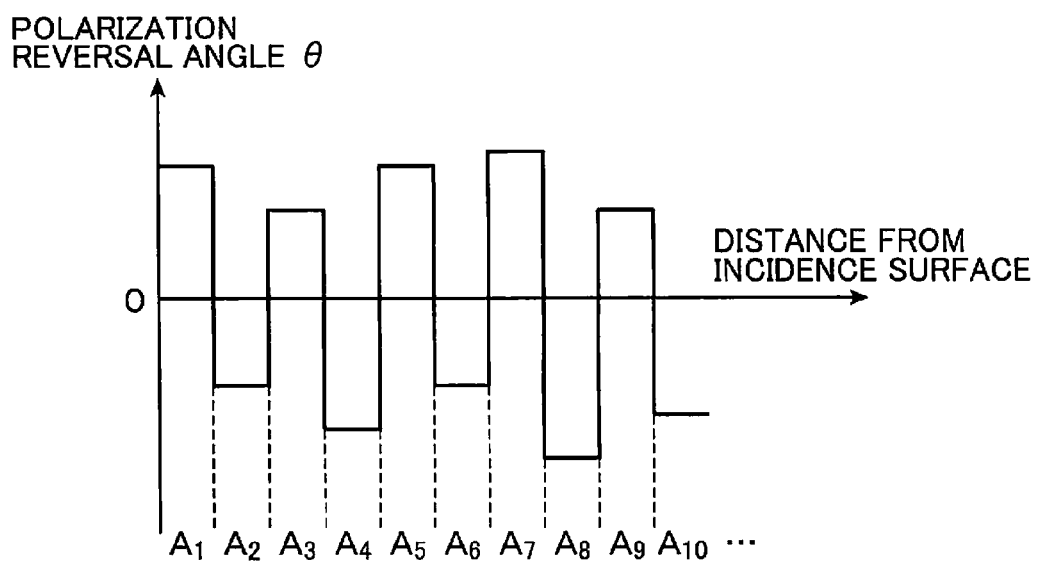
FIG. 6 exemplifies change in polarization reversal angle in the wavelength conversion laser light source according to the present invention.

More preferably, like a wavelength conversion laser light source 500 shown in FIG. 5, a wavelength conversion element 501 which has different polarization reversal angles $\theta$ between at least two adjacent polarization reversal regions may be used to further decrease the output instability due to reconversion.

It is also more preferable that polarization reversal angles of the odd-numbered polarization reversal regions (A1, A3, A5, ...) counting from the incidence surface of the wavelength conversion element is positive whereas polarization reversal angles of the even-numbered polarization reversal regions (A2, A4, A6, ...) is negative. Similarly, it is also preferable that polarization reversal angles of the odd-numbered polarization reversal regions (A1, A3, A5, ...) counting from the incidence surface of the wavelength conversion element is negative whereas polarization reversal angles of the even-numbered polarization reversal regions (A2, A4, A6, ...) is positive.

Under these conditions, larger reconversion of the second harmonic wave in one polarization reversal region is less likely to occur in the immediate polarization reversal region, which results in more stable output under smaller polarization reversal angles. Thus highly directional light is obtained with smaller polarization reversal angles. Therefore if this light source is used in a projector or another image display apparatus, it may be allowed to make its optical system compact.

Figure 10:
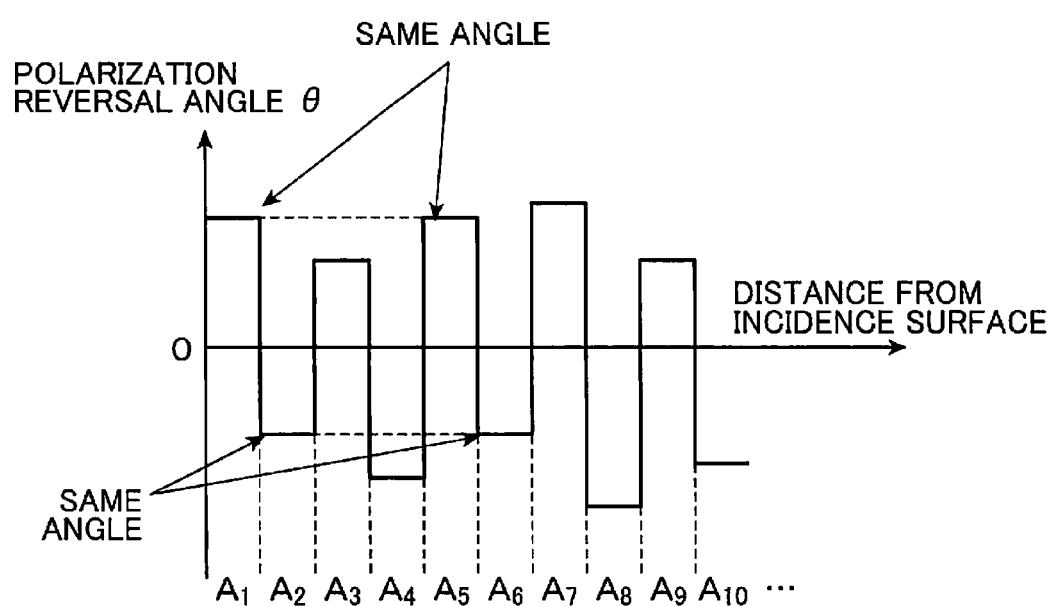
FIG. 10 exemplifies other change in polarization reversal angle in the wavelength conversion laser light source according to the present invention.

As shown in FIG. 10, it is preferable that at least two of the odd-numbered polarization reversal regions have the same polarization reversal angle, and similarly, at least two of the even-numbered polarization reversal regions have another common polarization reversal angle.

This aligns propagation directions of the generated second harmonic waves. Therefore if this light source is used in a projector or another image display apparatus, it may be allowed to incorporate a simpler (less expensive) optical system into it. It should be noted that increase in a number of polarization reversal regions of which the polarization reversal angle $\theta$ does not equal to 0 suppresses the reconverting phenomena to the fundamental wave as the difference frequency wave with the original fundamental wave to make the output more stable. However more various polarization reversal angles $\theta$ result in more various emitting directions of the laser light. It also should be noted that more various polarization reversal angles $\theta$ increases a number of types of polarization reversal axes in the wavelength conversion element, which may cause multi-directional stress in the wavelength conversion element. Therefore the variety of the polarization reversal angles is preferably as small as possible (for example, two or three types) to decrease a number of emitting direction of the laser light (to two or three directions). If this light source is used in a projector and alike, the projector and alike may achieve more efficient light utilization using compact and inexpensive optical system.

Figure 3:
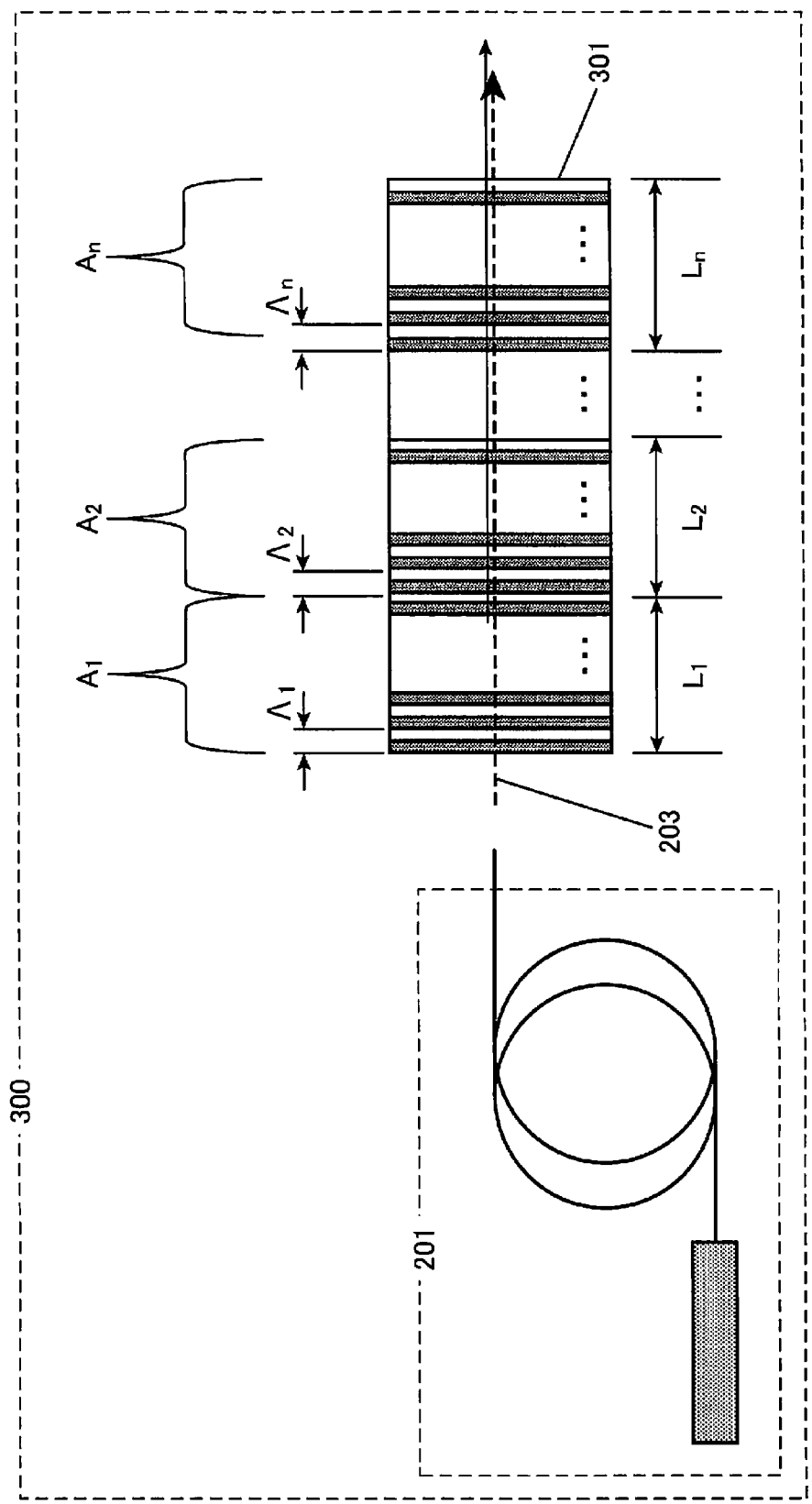
FIG. 3 shows schematic configuration of a conventional wavelength conversion laser light source with a broader wavelength range.
Figure 7A:
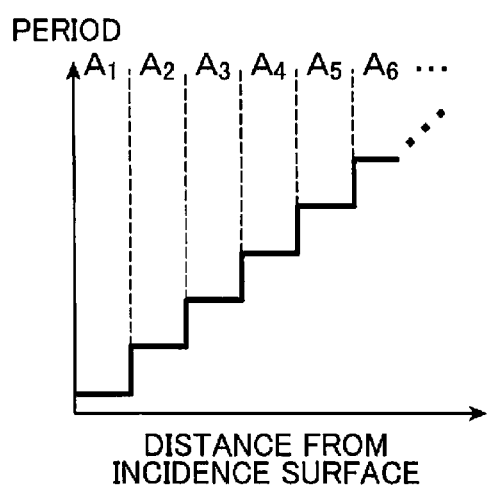
FIGS. 7A and 7B show change in polarization reversal period in a conventional wavelength conversion laser light source.
Figure 7B:
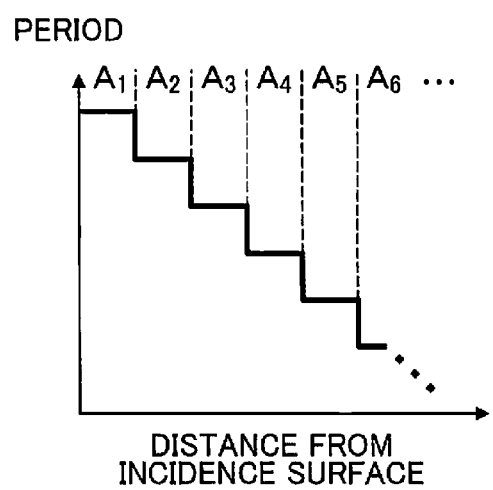

Further, of course for the above reasons, it is the most preferable that all of the odd-numbered polarization reversal regions have the same polarization reversal angle, similarly that all of the even-numbered polarization reversal regions have the same polarization reversal angle, while a sign (+/−) of the polarization reversal angles of the odd-numbered regions is opposite to a sign (−/+) of the polarization reversal angles of the even-numbered regions Further, in the case of the conventional wavelength conversion laser light source described in Non-patent Document 1 (or shown in FIG. 3), the polarization reversal period $\Lambda i$ (i=1,2, ..., n) is expressed by $\Lambda i=\Lambda 1+\Delta\Lambda(i-1)$, as aforementioned. Therefore the polarization reversal period of each polarization reversal region monotonically increases or decreases from a surface of the wavelength conversion element, on which the fundamental wave is incident, to a surface of the wavelength conversion element, from which the wavelength-converted light is emitted. This is shown in FIGS. 7A and 7B. In the conventional configuration, such arrangement of the polarization reversal periods (regions) is essential because the optical path of the fundamental wave is coincident with the optical path of the second harmonic wave. If two polarization reversal regions which have closer periods are separated, the output becomes less stable.

Figure 8:
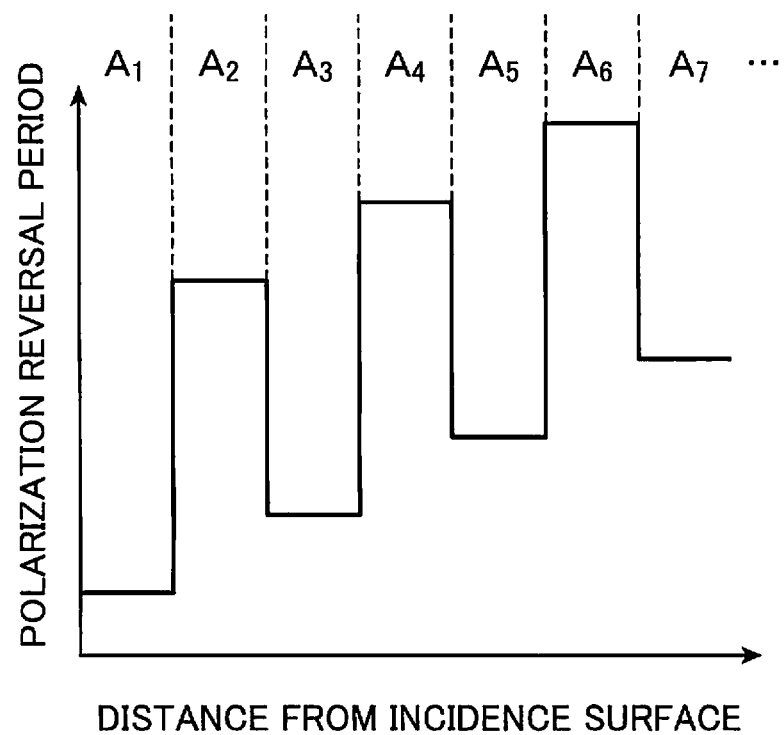
FIG. 8 exemplifies the change in polarization reversal period in the wavelength conversion laser light source according to the present invention.

On the other hand, according to the present invention, it is preferable that two polarization reversal regions which have closer periods are not adjacent to each other if polarization reversal regions adjacent to each other have different polarization reversal angles, as shown in FIG. 8. This is because it is likely that larger difference in polarization reversal periods between adjacent polarization reversal regions prevents interaction of emitted light from each region. Consequently, output instability resulting from the reconversion may be further suppressed.

Figure 12:
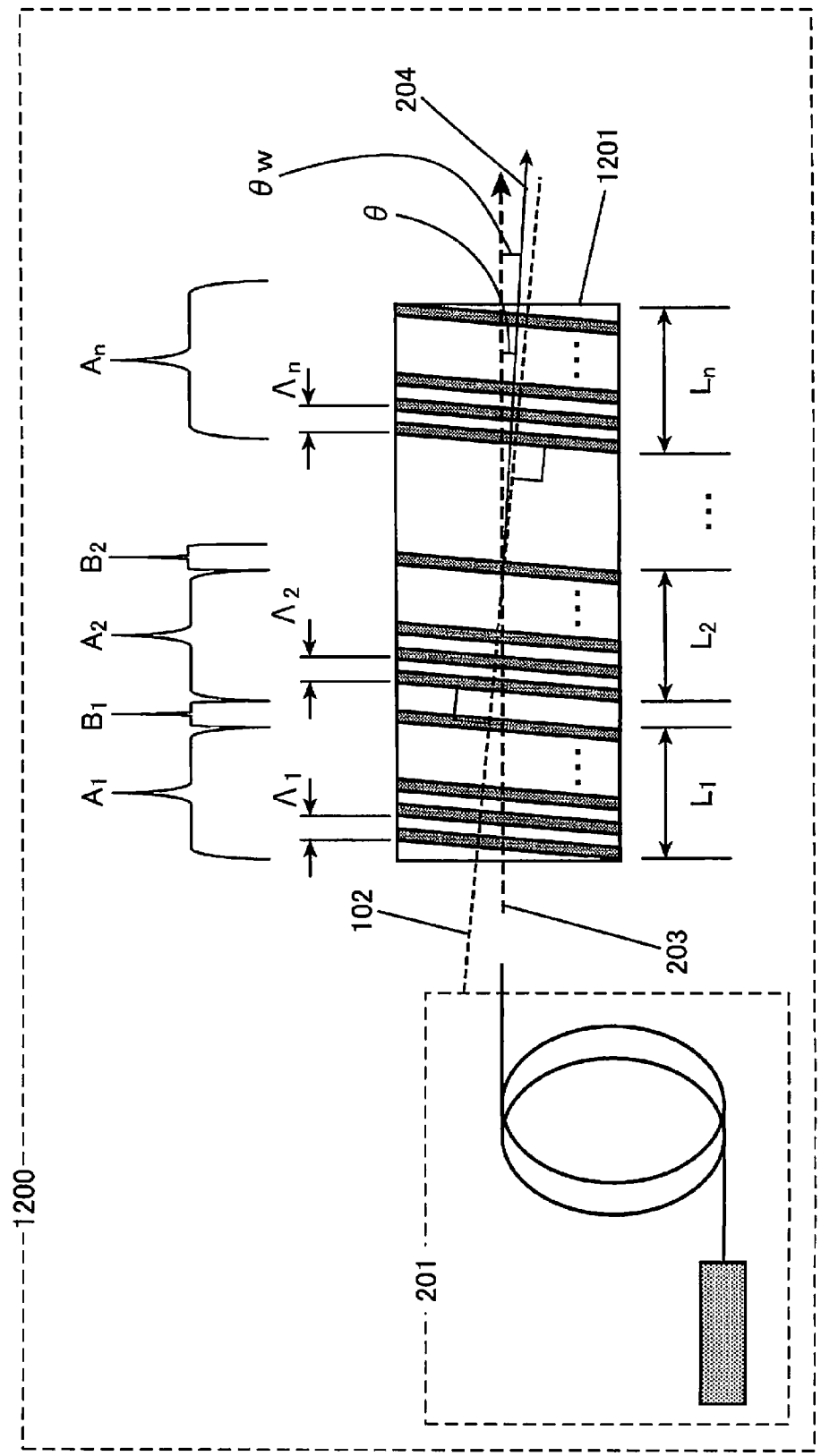
FIG. 12 shows schematic configuration of another wavelength conversion laser light source according to Embodiment 1 of the present invention.

In addition, as shown in FIG. 12, it is more preferable that between the adjacent polarization reversal region Ai and polarization reversal region Ai+1, there is a polarization non-reversal region Bi, in which a polarization reversal structure is not formed. By this means, a physical interval between an optical path of the green light emitted from the polarization reversal region Ai and an optical path of the infrared light in the polarization reversal region Ai+1 may be largely secured to weaken their interaction and further decrease the output instability due to the reconversion.

It should be also noted that different polarization reversal angles between adjacent regions as shown in FIG. 5 cause loads at boundaries between the polarization reversal regions to degrade the wavelength conversion element with time (decrease the wavelength conversion efficiency). It is likely that the interposition of the aforementioned polarization non-reversal region for such an element prevents the wavelength conversion efficiency of the wavelength conversion element from going down with time.

It should be also noted that an insulating material preferably covers intersecting surfaces with the polarization directions other than the incident surface of the laser light in the wavelength conversion element to further suppress the decline with time in the wavelength conversion efficiency.

A fiber laser is exemplified as the fundamental wave laser light source according to the present invention. Alternatively, solid-state laser crystals such as $\{Gd_2Y\}Sc_2(Al_2Ga)O_{12}$ or other ceramic material or alike may be used. In this case, a compact wavelength conversion laser light source with a broader wavelength range may be provided, and also a compact image display apparatus with a prominent effect in moderating speckle noise may be realized.

Similar problems may occur under arrangement of several different wavelength conversion elements in polarization reversal period with interposing spaces and other materials. However, in the case of such a configuration, light with a broader wavelength range may not be wavelength-converted unless temperatures of several elements are controlled to be constant under control of intervals between the wavelength conversion elements with nanometer-order precision. If there are several different regions in polarization reversal period in a single element like the present invention, advantageously, the temperature may easily become constant and the intervals between wavelength conversion elements (in the case of the same element, the intervals between polarization reversal regions) is less likely to change.

(Embodiment 2)

Another embodiment according to the present invention is described below with reference to the drawings.

Figure 9:
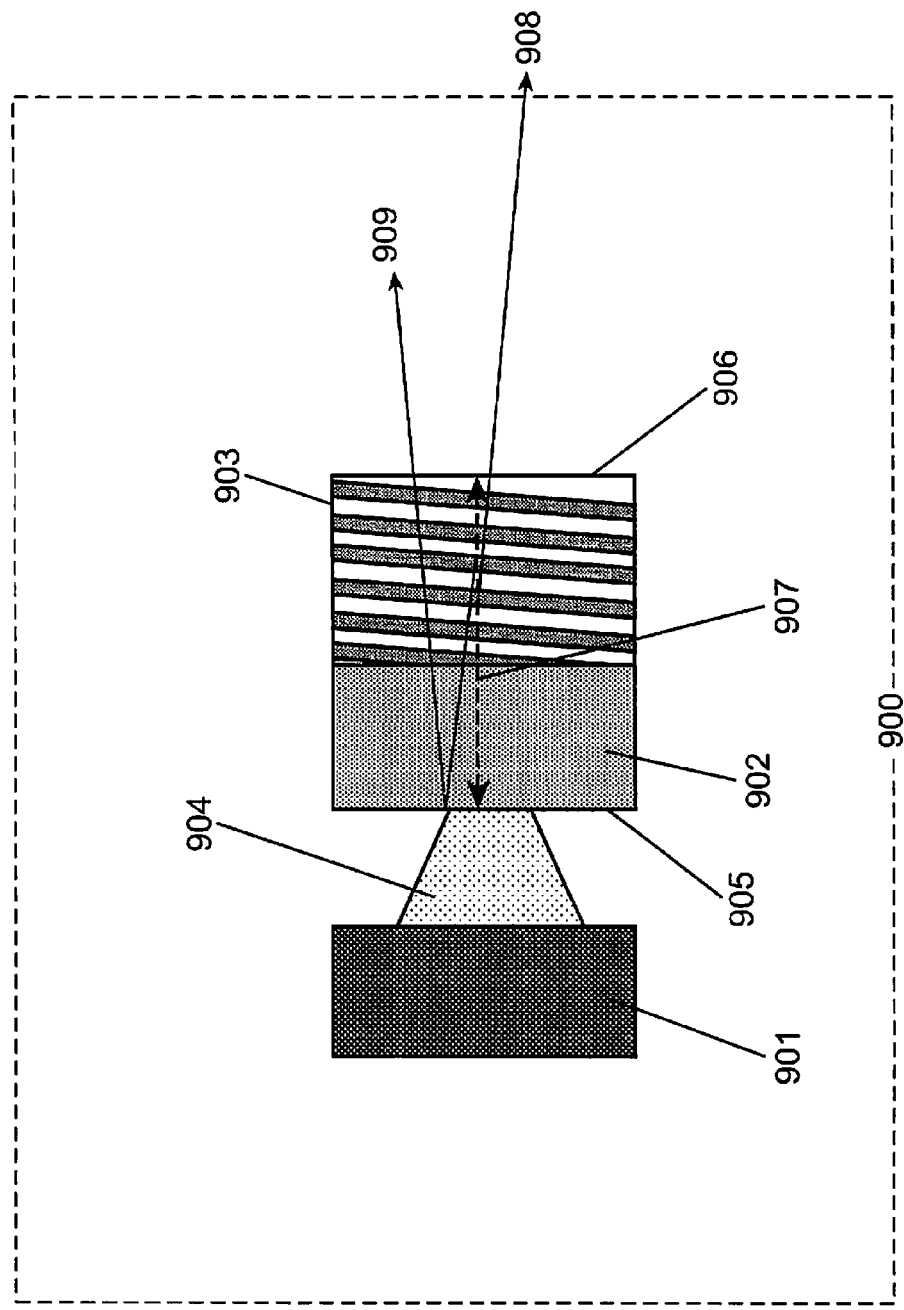
FIG. 9 shows schematic configuration of a wavelength conversion laser light source according to Embodiment 2 of the present invention.

FIG. 9 shows schematic configuration of a wavelength conversion laser light source 900 according to Embodiment 2 of the present invention. The wavelength conversion laser light source 900 according to this configuration comprises a semiconductor laser 901 (pumping laser light source), solid-state laser crystal 902 and wavelength conversion element 903. The pump light 904 at wavelength 808 nm emitted by the semiconductor laser 901 excites the solid-state laser crystals 902, in which Nd is added to $YVO_4$, to generate the fundamental wave 907. A transmission-prevention coating for the fundamental wave and the second harmonic wave, which also works as a reflection prevention coating for the pump light, is formed on the pump light incident surface of the solid-state laser crystal 902. The opposite surface to the pump light incident surface is subjected to hydrophilic treatment. A wavelength conversion element 903 comprising lithium niobate, which is similarly subjected to hydrophilic treatment, is bonded to the opposite surface to the pump light incident surface (hereafter called direct bonding) to obtain an optically bonded state. A reflection prevention coating for the second harmonic wave, which also works as a transmission prevention coating for the fundamental wave, is formed at the opposite surface 906 of the wavelength conversion element 903 to the surface directly bonded with the solid-state laser crystal 902. The fundamental wave 907 generated in the solid-state laser crystals 902 resonates and oscillates between the two transmission prevention coatings which interpose the solid-state laser crystals 902 and the wavelength conversion element 903. The wavelength conversion element 903 provided in this resonator, like the wavelength conversion element 101 according to Embodiment 1 (FIG. 1), has polarization reversal periods formed such that the polarization reversal axis is inclined with respect to the optical axis of the fundamental wave. Thus the fundamental wave 907 is converted into second harmonic waves 908, 909 which obliquely propagate with respect to the optical axis of the fundamental wave.

If there is a wavelength conversion element in a fundamental wave resonator, like the present embodiment, the second harmonic wave 909 propagating toward the solid-state laser crystal 902 in the wavelength conversion element 903 and the second harmonic wave 908 propagating toward the opposite side thereof are generated.

In this way, the phenomena in which the second harmonic wave, which has once been wavelength-converted and generated, is reconverted into the fundamental wave as the difference frequency wave with the original fundamental wave may occur even if the solid-state laser crystal 902 and wavelength conversion element 903 are placed in a single resonator so that an optical path of the second harmonic wave is coincident with an optical path of the fundamental wave. The phenomena is described hereinafter.

According to general configuration of the prior art, the optical axis of the fundamental wave is coincident with the polarization reversal axis (, the polarization reversal angle is 0). If the solid-state laser crystals 902 and a wavelength conversion element 903 are bonded together, unlike Embodiment 1, light travels back and forth several times in the solid-state laser crystal and the wavelength conversion element. In such a case, light generated from the wavelength conversion element, propagating toward the solid-state laser crystals and then reflected by the surface with the transmission prevention coating 905 to return again to the wavelength conversion element, like the second harmonic wave 909, is reconverted by means of the difference frequency wave with the fundamental wave. It should be noted that the reconversion amount depends on a phase relationship between the fundamental wave and the second harmonic wave, so that the reconversion amount is more sensitive to temperature changes of the solid-state laser crystals and the wavelength conversion element as well as change in wavelength of the resonating fundamental wave. Therefore the output becomes unstable.

As described above, even except for the case of the wavelength conversion element including several different polarization reversal regions in polarization reversal period like Embodiment 1, if a wavelength conversion element is disposed in a resonator, similar issues may happen in both cases of a single polarization reversal region and several polarization reversal regions.

This output instability is a specific problem to a wavelength conversion laser light source comprising a wavelength conversion element in a fundamental wave resonator in which a surface configured to reflect the second harmonic wave is coincident with a wave front of the fundamental wave. The present invention works to overcome the problem as well.

The solid-state laser crystals 902 may macroscopically considered as a non-periodic region. The specific problem happening in an element including two bonded regions different in polarization reversal period is common to the Embodiments 1 and 2.

It should be noted that a wavelength conversion element comprising several different polarization reversal regions in polarization reversal period is more preferably used than a wavelength conversion element which entirely has a constant polarization reversal period in order to achieve more efficient wavelength conversion for fundamental waves over a broader wavelength range.

A wavelength conversion element may be preferably configured so that intervals between polarization reversal regions greatly deviate from integral multiples of the surrounding polarization reversal periods (for example, (0.2 to 0.8+an integer)-fold), respectively, in order to make the wavelength conversion efficiency of the wavelength conversion laser light source less sensitive to change in wavelength, if the polarization reversal periods of the polarization reversal regions are consistent.

It should be noted that, like Embodiment 1, larger walkoff angle decreases the reconversion and increases output of the second harmonic wave. However after the output of the second harmonic wave reaches a certain magnitude or greater, decline in efficiency becomes more apparent because of shorter interaction length between the fundamental wave and the second harmonic wave, so that increase in the walkoff angle reduces the output of the second harmonic wave. As shown by the experimental results of FIG. 13, therefore the absolute value of the walkoff angle is preferably set, in particular, to 0.1° or greater and 0.5° or less. In this range, a higher output of the second harmonic wave may be obtained than when the walkoff angle is 0. In addition, it is preferable that a polarization reversal angle of a lithium niobate-based wavelength conversion element is particularly 2.9° or greater and 14.6° or less because this range is equivalent to the aforementioned range. Similarly, it is preferable that a polarization reversal angle of a lithium tantalite-based wavelength conversion element is 3.3° or greater and 16.6° or less because this range is equivalent to the aforementioned range.

In the embodiment, the direct bonded configuration between the solid-state laser crystals and the wavelength conversion element is described. Alternatively, the solid-state laser crystals may be separated from the wavelength conversion element. Further alternatively, a concave mirror and lens may be disposed in a resonator. However it should be noted that the wavelength conversion laser light source according to the present configuration comprising the direct bonded configuration between the solid-state laser crystals and the wavelength conversion element as well as the resonator formed with their bonding surface and the opposite surface is more preferable because such a configuration contributes to making the wavelength conversion laser light source compact and inexpensive.

Figure 11:
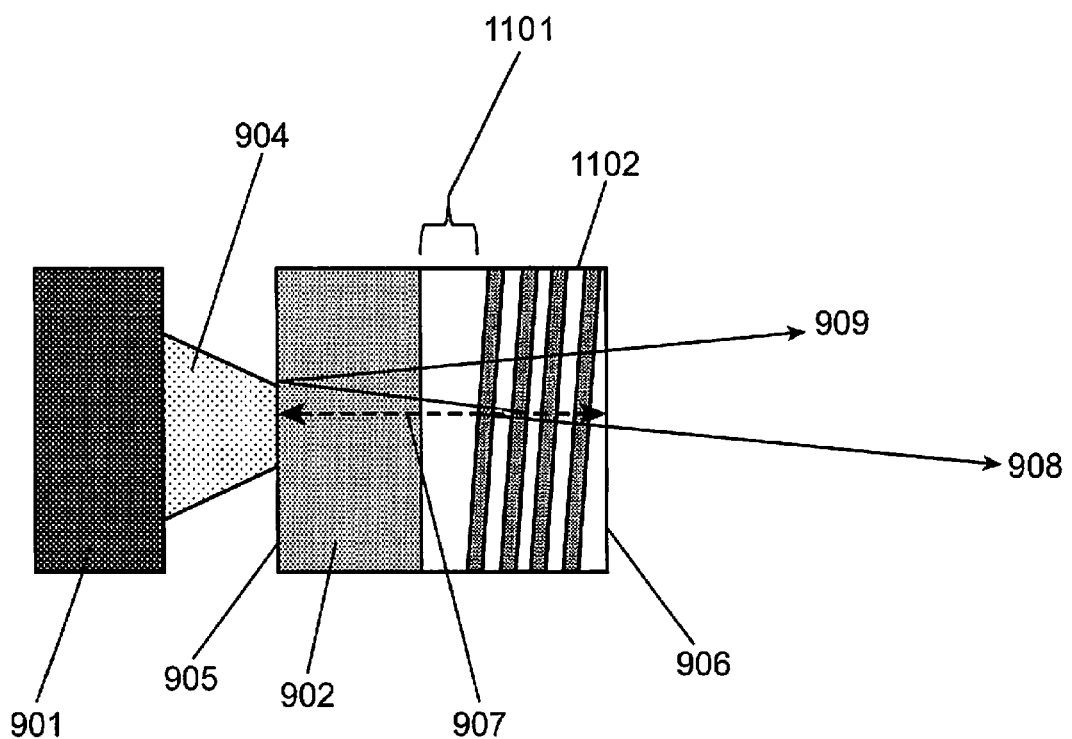
FIG. 11 shows schematic configuration of another wavelength conversion laser light source according to Embodiment 2 of the present invention.

It should be also noted that the present inventor figured out issues on temporal decline of the wavelength conversion efficiency which occurs if polarization directions are reversed in a surface of the wavelength conversion element directly bonded to the solid-state laser crystals. In this case, as shown in FIG. 11, a wavelength conversion element 1102 comprising a polarization non-reversal formation region 1101, in which polarization reversal periods are not formed beside the contact surface with the solid-state laser crystals, is preferably used to suppress the aforementioned temporal decline.

It should be also noted that the wavelength conversion element according to the present embodiment, like Embodiment 1, may preferably comprise several different polarization reversal regions in period to enlarge an oscillation wavelength range. Like Embodiment 1, it is more preferable that the polarization reversal angle is different for each polarization reversal region so that the signs (+/−) of the polarization reversal angles for the odd-numbered and even-numbered polarization reversals from the incidence surface alternate. It is preferable that at least two regions of the odd-numbered polarization reversal regions have the same polarization reversal angle while at least two regions of the even-numbered polarization reversal regions have the same polarization reversal angle. If there are two polarization reversal regions which have closer periods, it is preferable that they are not adjacent to each other. There is preferably a non-formation region free from a polarization reversal structure between polarization reversal regions. (The reasons and advantageous results are similar to those in Embodiment 1).

In the embodiment, $YVO_4$ to which Nd is added is exemplified as the solid-state laser crystal 902. Alternatively another solid-state laser crystal material is used in the present invention to obtain similar advantageous results. For example, $YVO_4$ to which Yb is added, YAG to which Nd or Yb is added or alike may be used.

A ceramic material such as $\{Gd_2Y\}Sc_2(Al_2Ga)O_{12}$ and alike may be used as a solid-state laser crystal according to the present embodiment to provide a broader wavelength range of the wavelength conversion laser light source. Therefore if the wavelength conversion laser light source is used for an image display apparatus, the speckle noise largely decreases.

Figure 15:
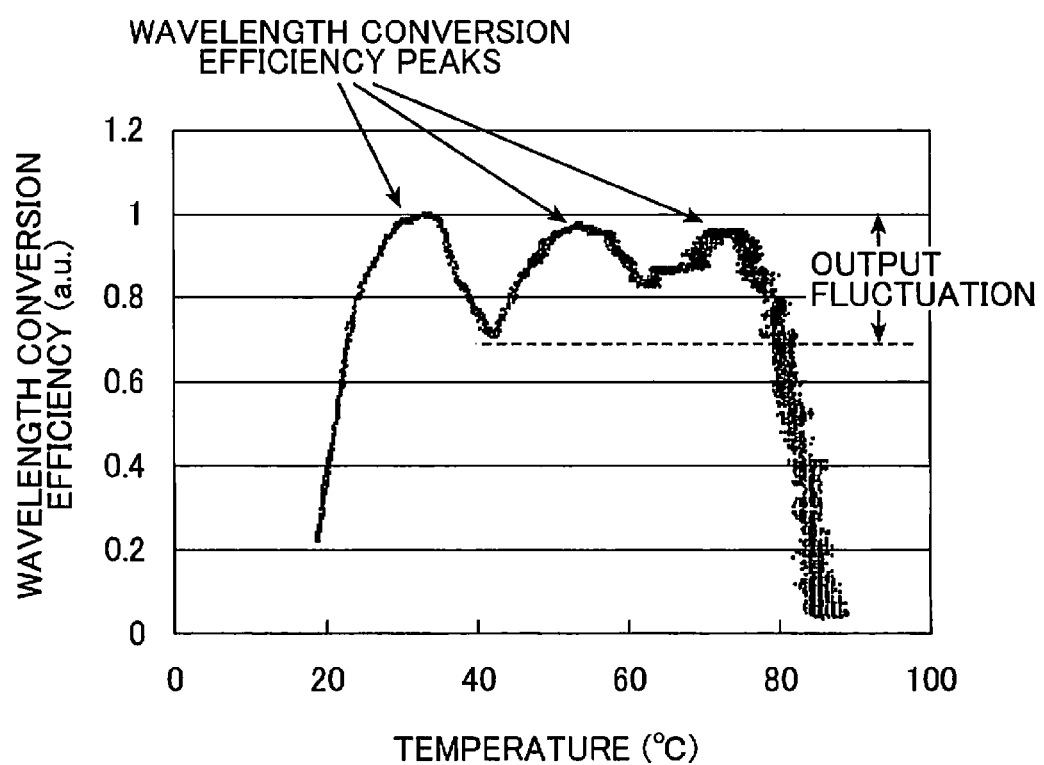
FIG. 15 shows a relationship between wavelength conversion element temperature and wavelength conversion efficiency when fundamental wave of a single wavelength is made incident on the wavelength conversion element according to the present invention.

It should be noted that the wavelength conversion efficiency has temperature characteristics with peaks and valleys (several local maximum values) as shown by the experimental results of FIG. 15 under incidence of the fundamental wave with a single wavelength on the wavelength conversion element comprising several different polarization reversal regions in period. Therefore a fundamental wave light source configured to deliver two or more wavelengths as shown by the spectral distribution of FIG. 18 is preferably used to moderate the peaks and valleys in the temperature characteristics, as indicated by the experimental results of FIG. 19.

Figure 18:
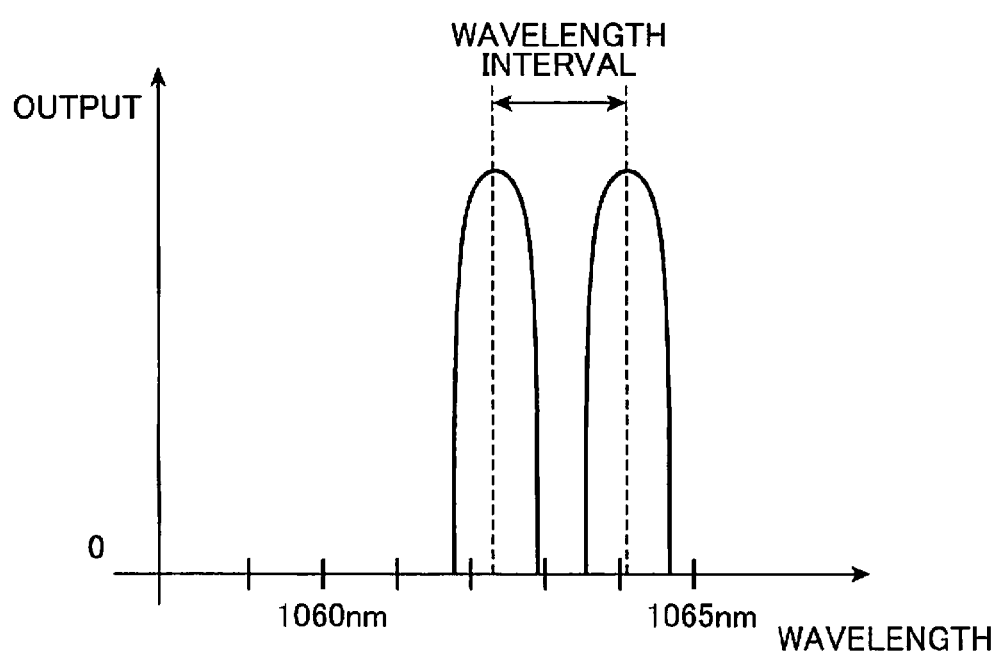
FIG. 18 exemplifies another fundamental wave spectral distribution in the wavelength conversion laser light source according to the present invention.
Figure 19:
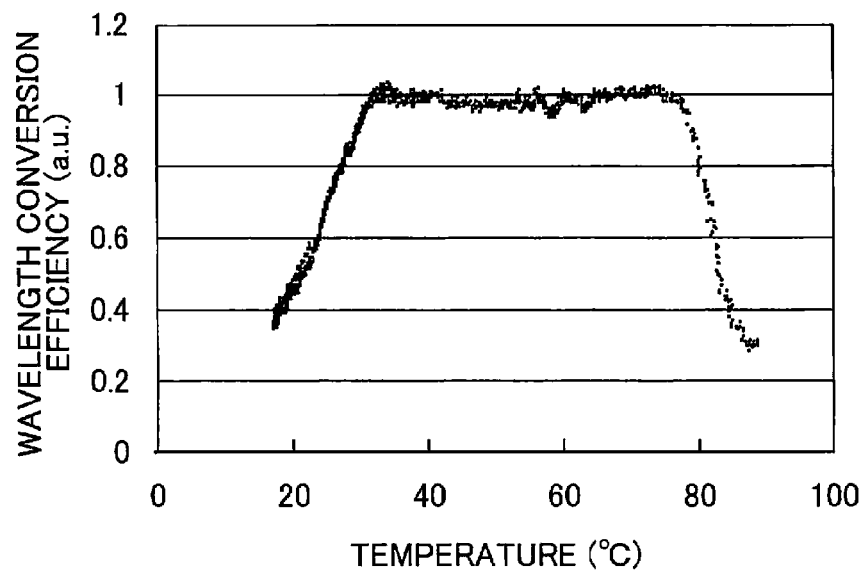
FIG. 19 shows a relationship between wavelength conversion element temperature and wavelength conversion efficiency when the fundamental wave with the spectral distribution of FIG. 18 is made incident on the wavelength conversion element according to the present invention.
Figure 20:
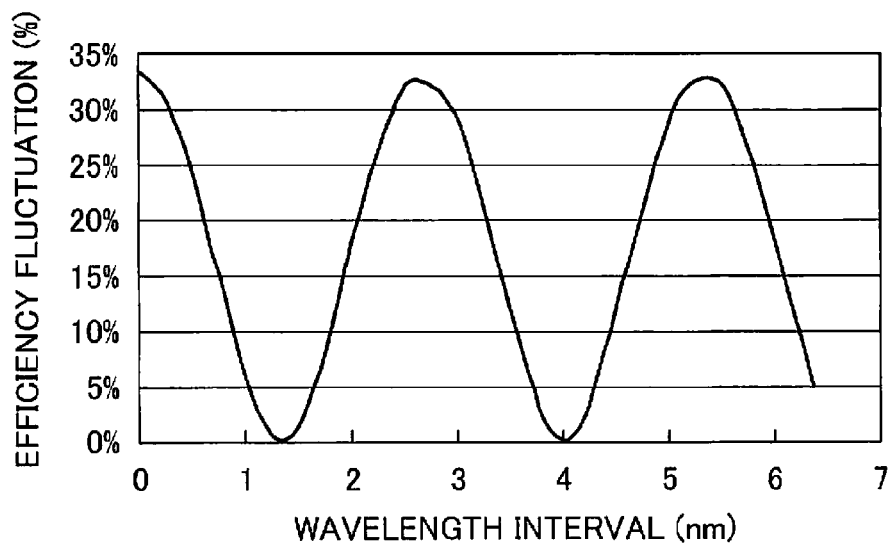
FIG. 20 shows a relationship between fundamental wave wavelength interval and fluctuation in wavelength conversion efficiency.

FIG. 20 shows a relationship between the wavelength intervals (difference between wavelengths of two fundamental waves) shown in FIG. 18 and the efficiency fluctuation (change rate from a local maximum value to a local minimal value in the wavelength conversion efficiency) shown in FIG. 15, in the case of the wavelength conversion element of which the wavelength conversion efficiency has peaks (local maximum values) at approximately 20° C. intervals for a single-wavelength fundamental wave, as shown in FIG. 15.

In the case of any wavelength interval, the efficiency fluctuation is suppressed in comparison with incidence of the single-wavelength fundamental wave. It is more preferable that the relationship of $(0.67+1.33\times p)$>wavelength interval>$(-0.67+1.33\times p)$ is satisfied. In this range, the efficiency fluctuation may be reduced to half or less, compared with the single wavelength. Therefore the efficiency fluctuation may be much more moderated. It should be noted that p is an arbitrary positive integer.

If the peak interval in the wavelength conversion efficiency for incidence of a single-wavelength fundamental wave is expressed by q° C., a more general relationship of $(0.033+0.067\times p)\times q$>wavelength interval>$(-0.033+0.67\times p)\times q$ is obtained. It is preferable that a fundamental wave light source which satisfies this range is used to reduce the efficiency fluctuation to half or less.

The above remarks may be also applied to wavelength conversion laser light sources using quasi-phase matched wavelength conversion elements. Therefore similar remarks may be also applicable to wavelength conversion laser light sources using a quasi-phase matched wavelength conversion element mainly consisting of lithium tantalate, KTP or alike in addition to lithium niobate.

Figure 21:
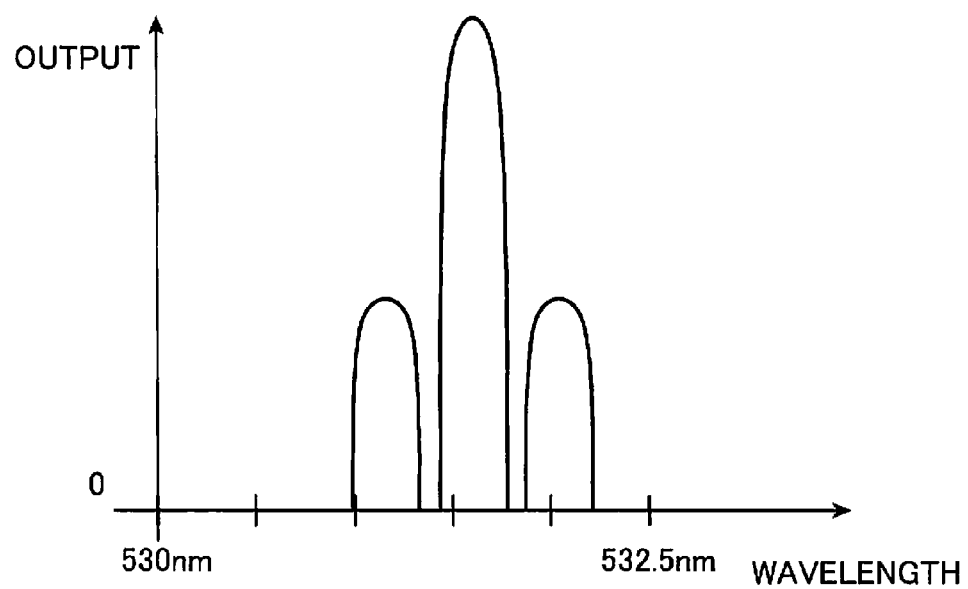
FIG. 21 exemplifies a spectral distribution of a second harmonic wave according to the present invention.
Figure 22:
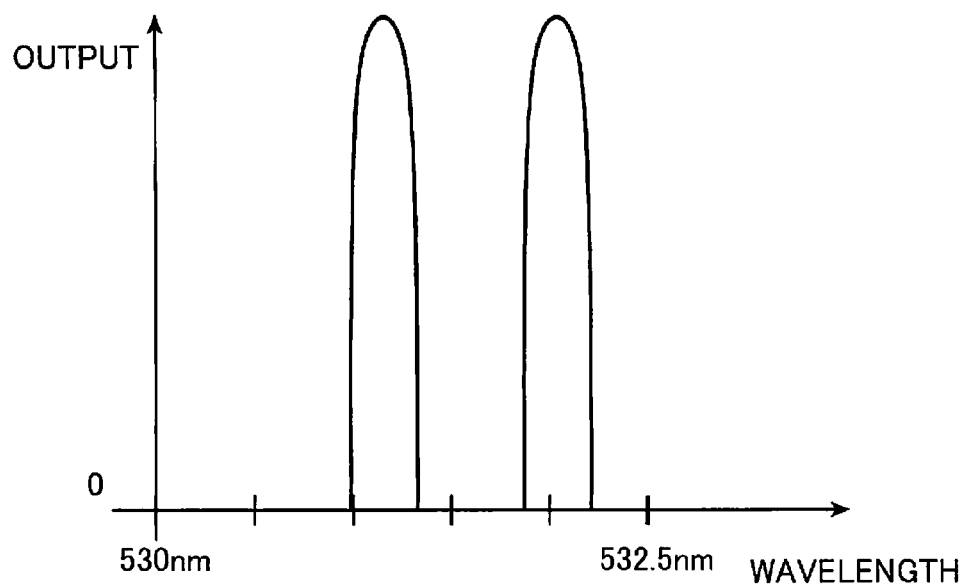
FIG. 22 exemplifies another spectral distribution of a second harmonic wave according to the present invention.

It should be noted that if a fundamental wave light source having two peak wavelengths is used with a conventional wavelength conversion element with a constant polarization reversal angle, sum frequency wave of each second harmonic wave and the two fundamental waves are generated, so that green light with three wavelengths is obtained, as shown in FIG. 21. On the other hand if a wavelength conversion element of which polarization reversal regions are different in polarization reversal angle is used, it is less likely that the sum frequency wave occurs. As shown in FIG. 22, it may become possible to generate green light with only two wavelengths, so that speckle noise may be further suppressed.

Further, a semiconductor laser emitting pump light of wavelength 880 nm may be used to excite the solid-state laser crystals 902 to increase excitation efficiency from the pump light to the fundamental wave, so that the laser light consumes less power.

(Embodiment 3)

Yet another embodiment according to the present invention is described hereinafter with reference to the drawings.

Conventional wavelength conversion laser light sources also have a problem that a designed wavelength allowance range is not achieved because of variation in manufacturing wavelength conversion elements.

Further, this problem causes fluctuation in output of the second harmonic wave, which results from generation of fluctuations in wavelength of the fundamental wave light source. This is described hereinafter.

Figure 27:
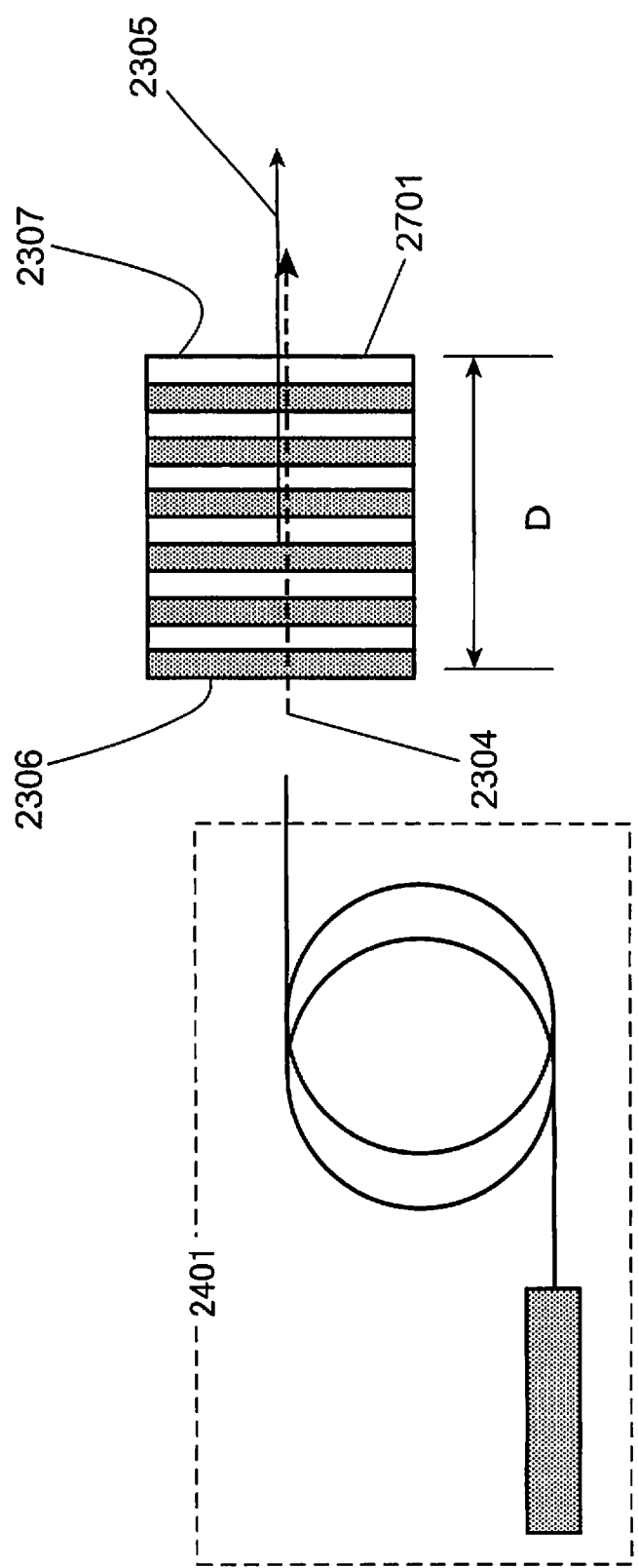
FIG. 27 schematically exemplifies configuration of a conventional wavelength conversion laser light source.

As shown in FIG. 27, a wavelength conversion element has to have an incidence surface 2306 on which the fundamental wave is incident, and an emission surface 2307 from which the wavelength-converted second harmonic wave is emitted. The incidence and emission surfaces 2306, 2307 are optically polished. However, if the polishing finishing position is shifted from the designed position, which varies the distance between the incidence and emission surfaces, the designed wavelength allowance range is not obtained.

It should be noted that this problem occurs not only in the "wavelength conversion element comprising several different polarization reversal regions in period" described in the context of Embodiments 1 and 2, but also in pseudo-phase matched wavelength conversion elements in which a polarization reversal structure with a consistent period from the incidence surface to the emission surface is formed (hereafter called a single-period wavelength conversion element), and in birefringent phase-matched wavelength conversion elements.

Figure 28:
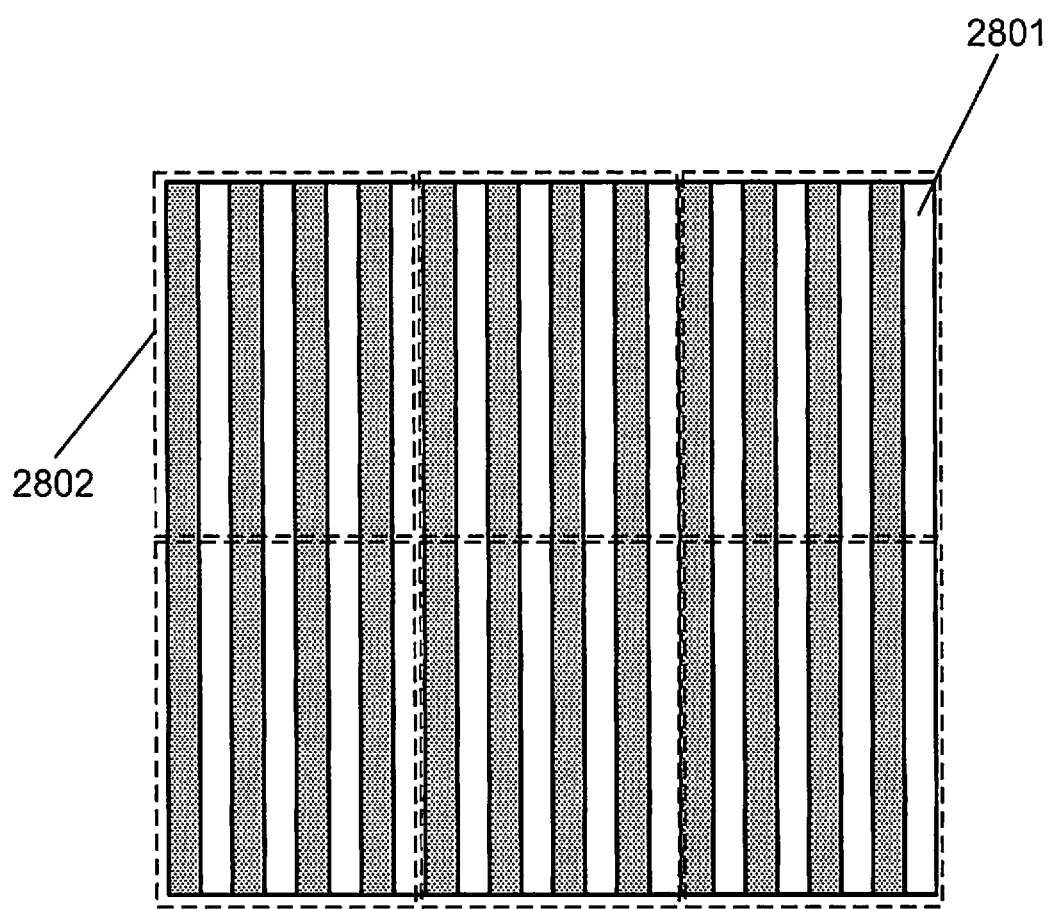
FIG. 28 shows schematic configuration of a nonlinear optical crystal substrate from which a conventional wavelength conversion element is cut out.

FIG. 28 exemplifies a method for manufacturing a single-period wavelength conversion element. As shown in FIG. 28, a nonlinear optical crystal substrate 2801, in which a single-period polarization reversal structure is formed, is cut along the dashed lines 2802 into wavelength conversion elements. The cut surfaces of each wavelength conversion element are polished to be the light incidence and emission surfaces, and thereby the wavelength conversion elements are manufactured.

Figure 25:
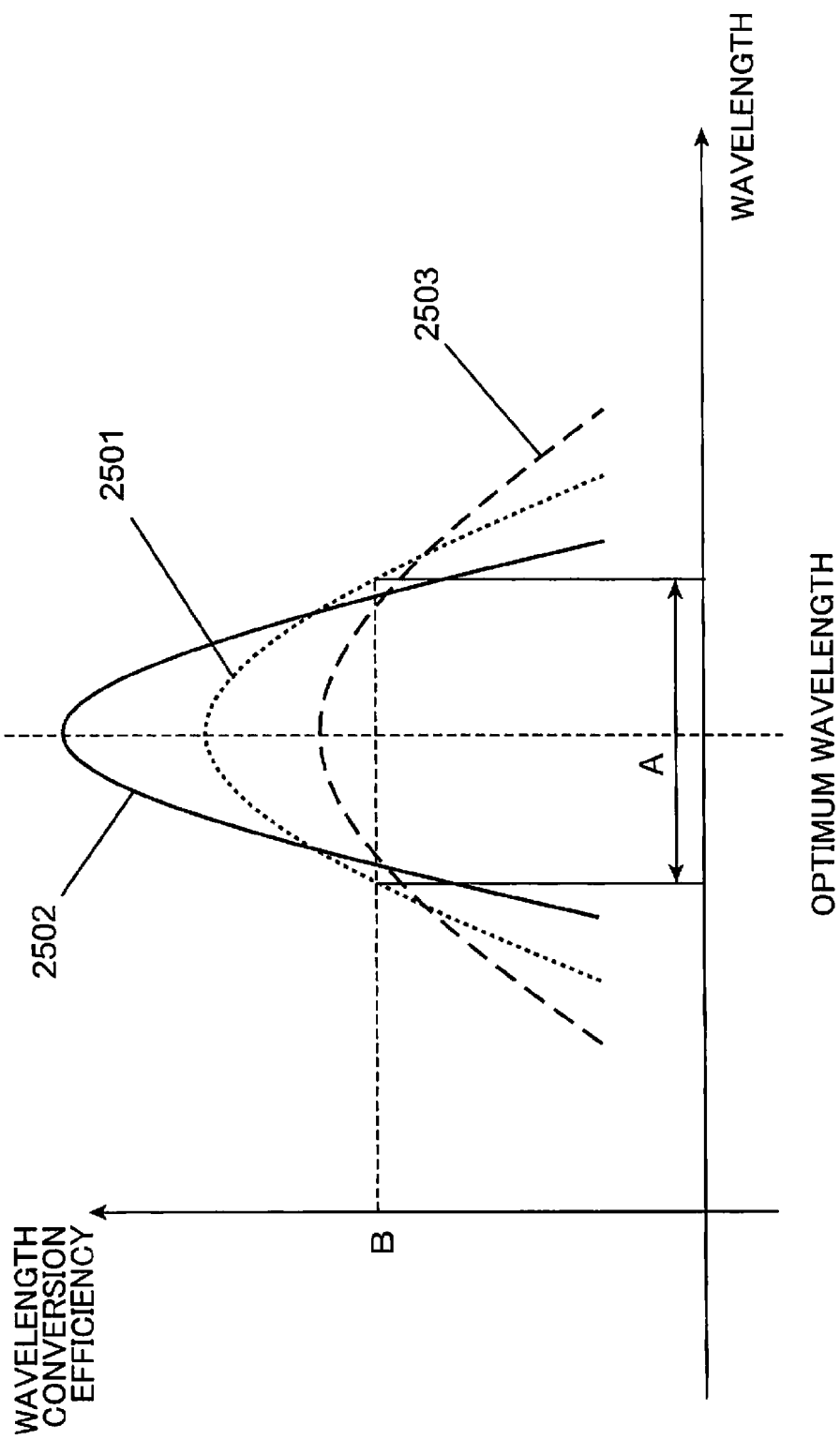
FIG. 25 shows a relationship between fundamental wavelength and wavelength conversion efficiency in a conventional wavelength conversion laser light source.

The wavelength conversion elements manufactured in this manner achieves the maximum wavelength conversion efficiency at the optimum wavelength, as indicated by the dotted line 2501 in FIG. 25. The wavelength conversion efficiency decreases as the wavelength deviates from the optimum wavelength.

A relationship between wavelength and wavelength conversion efficiency as indicated by the dotted line 2501 in FIG. 25 is described. It should be noted that an interaction length D between the wavelength conversion element and the fundamental wave, which is equivalent to the distance from the incidence surface to the emission surface in the case of the configuration shown in FIG. 27, is set to a desired distance.

If the interaction length D between the wavelength conversion element and the fundamental wave is longer than the desired length, the wavelength conversion efficiency increases at the optimum wavelength whereas deviation of the wavelength from the optimum wavelength more apparently make the wavelength conversion inefficient, as shown by the solid line 2502 in FIG. 25.

Conversely, if the interaction length D between the wavelength conversion element and the fundamental wave is shorter than the desired length, deviation of the wavelength from the optimum wavelength less apparently makes the wavelength conversion inefficient, as shown by the dashed line 2503 in FIG. 25, whereas the wavelength conversion efficiency at the optimum wavelength goes down.

Therefore if it is required as characteristics of a wavelength conversion element that wavelength conversion efficiency over the entire wavelength range shown in A of FIG. 25 exceeds the wavelength conversion efficiency B, the required characteristics may not be obtained in either case of shorter or longer distance from the incidence surface to the emission surface of the wavelength conversion element than the desired distance. It is necessary to finely control the finishing position of polishing, in order to tune the distance, although it is not practical.

Wavelength conversion laser light sources exemplified in Embodiments 3 and 4 comprise wavelength conversion elements configured to suppress reduction of the wavelength conversion efficiency in a prescribed wavelength range including the optimum wavelength even if the distance from the incidence surface to the emission surface of the wavelength conversion element deviates from the desired distance.

It should be noted that the wavelength conversion laser light sources described hereinafter provides stable output even if the fundamental wave changes in wavelength.

Figure 23:
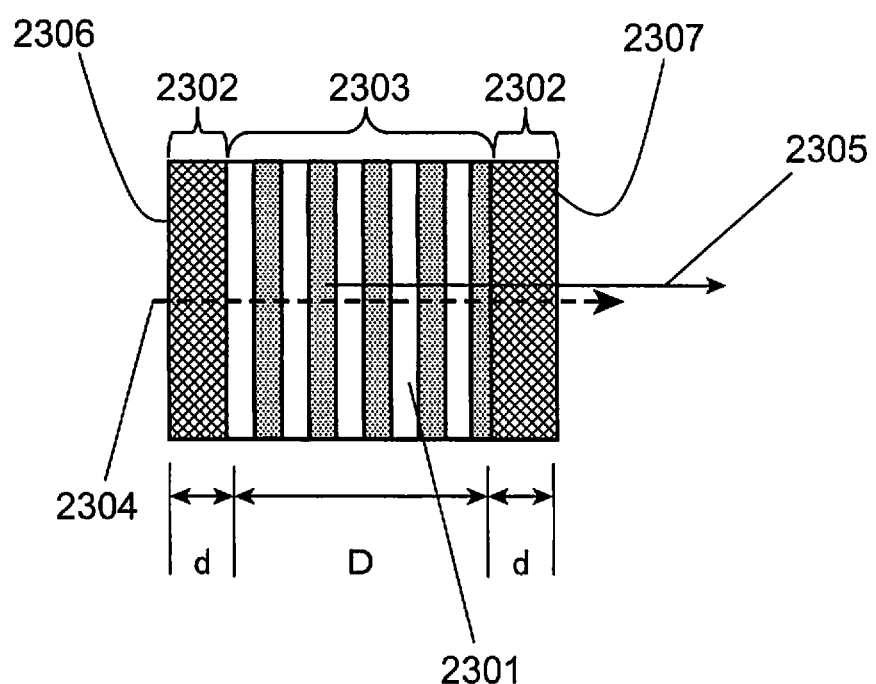
FIG. 23 shows schematic configuration of a wavelength conversion element according to Embodiment 3 of the present invention.

FIG. 23 shows schematic configuration of the wavelength conversion element of the wavelength conversion laser light source according to Embodiment 3 of the present invention.

The wavelength conversion element 2301 comprises a wavelength conversion region 2303 in which a polarization reversal structure is formed and non-wavelength-converting regions 2302 on both ends of the wavelength conversion region 2303. The polarization reversal structure formed in the wavelength conversion region 2303 is, for example, approximately 7 mm in period to work as a quasi-phase matched type wavelength conversion element mainly consisting of lithium niobate. The fundamental wave 2304 incident on the wavelength conversion element 2301 is converted into the second harmonic wave 2305 to be emitted.

The non-wavelength-converting region 2302, which is formed on one end or preferably both ends of the wavelength conversion region 2303, is free from a polarization reversal structure. It is less likely that the fundamental wave 2304 is subjected to wavelength conversion there.

The non-wavelength-converting region 2302 is formed on one of or both of the end surface 2306 of the wavelength conversion element 2301, on which the fundamental wave 2304 is incident, and the end surface 2307 of the wavelength conversion element 2301, from which the second harmonic wave 2305 is emitted. In short, the non-wavelength-converting region 2302 is formed on end surfaces intersecting the perpendicular line to the polarization reversal walls (boundaries at which the polarization reversal changes) of the polarization reversal structure in the wavelength conversion region 2303 among the end surfaces of the wavelength conversion element 2301. The non-wavelength-converting regions 2302 shown in FIG. 23 are formed on the entire end surfaces 2306, 2307 of the wavelength conversion element 2301. Alternatively, the non-wavelength-converting regions may cover only regions through which the fundamental wave 2304 or the second harmonic wave 2305 passes.

The lengths d of the two non-wavelength-converting regions 2302 shown in FIG. 23 are equivalent. Alternatively, the length on the left of the wavelength conversion region 2303 on which the fundamental wave is incident may be different from the length on the right of the wavelength conversion region 2303 from which the second harmonic wave is emitted according to a purpose.

For example, if it is required to decrease loss in the emitted second harmonic wave in order to further increase the output, the length of the non-wavelength-converting region arranged on the side from which the second harmonic wave is emitted (hereafter called d2) may be shorter than the length of the non-wavelength-converting region arranged on the side on which the fundamental wave is incident (hereafter called d1).

In this case, it is less likely that the end surface polishing changes the interaction length D between the wavelength conversion region 2303 and the fundamental wave 2304 because the non-wavelength-converting region is lengthened, which results in more stable performance of the wavelength conversion element. On the other hand, the longer length d2 of the emission side of the non-wavelength-converting region may result in larger loss of the emitted second harmonic wave. Therefore it is preferable that the length d2 is shorter than d1 as aforementioned to achieve both of the stable element performance and low second harmonic wave loss.

If the power of the incident fundamental wave is comparatively higher, it is preferable that the length d1 of the non-wavelength-converting region is shorter than d2. If the fundamental wave power is higher, it may be expected that the length d1 of the non-wavelength-converting region absorbs the fundamental wave to cause thermal lens effects, which degrade beam quality. Therefore if it is expected that power of the collaborated fundamental wave is higher, d1 may be shorter than d2, in order to prevent the beam quality from degrading and achieve stable performance at the emission side of the element.

Figure 24:
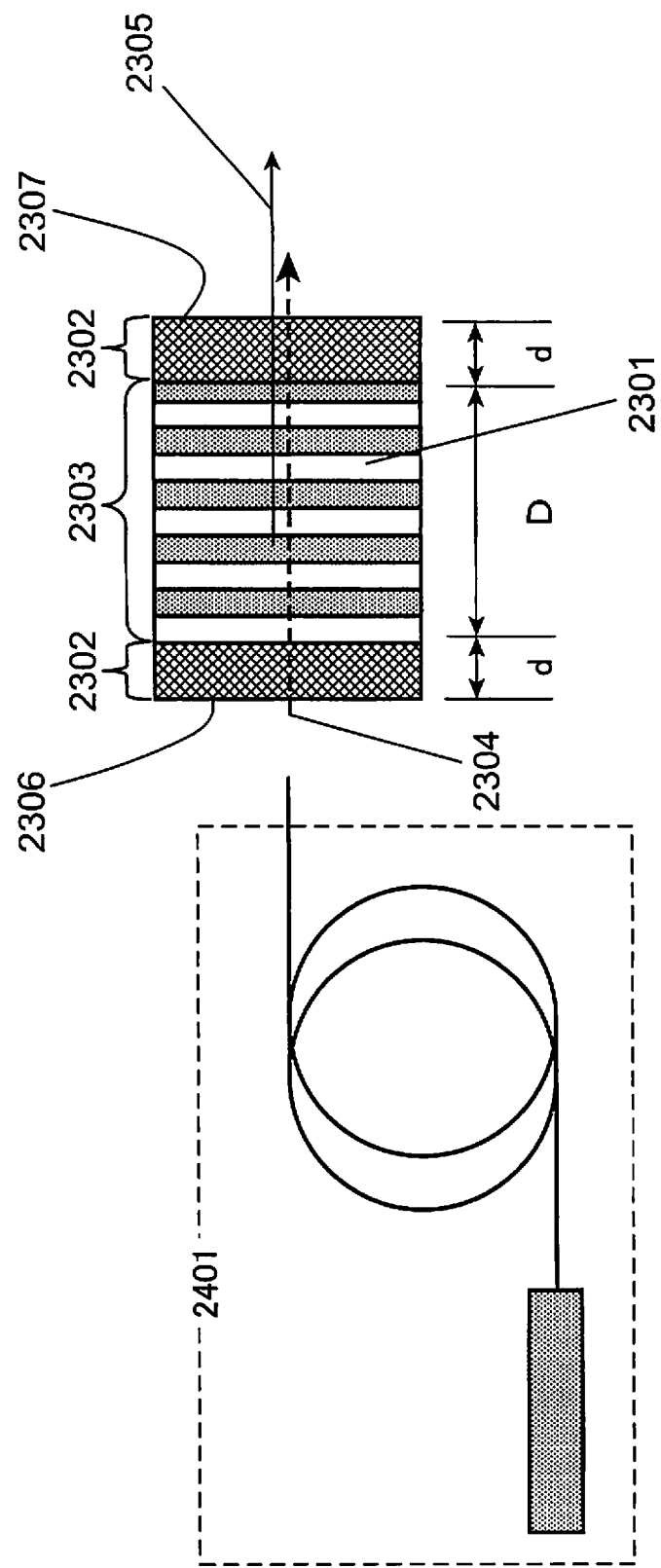
FIG. 24 shows schematic configuration of the wavelength conversion laser light source according to Embodiment 3 of the present invention.

Next, FIG. 24 shows schematic configuration of the wavelength conversion laser light source according to Embodiment 3 of the present invention.

In this configuration, the fundamental wave 2304 generated by the fundamental wave light source 2401 is incident on the wavelength conversion element 2301 and converted into the second harmonic wave (the second harmonic wave 2305). It should be noted that the fundamental wave light source 2401 is a fiber laser comprising a pump semiconductor laser and that the fundamental wave is infrared light of wavelength 1064 nm.

The wavelength conversion element 2301 comprises a wavelength conversion region 2303 in which a polarization reversal structure is formed to have a period of approximately 7 μm as a quasi-phase matched wavelength conversion element mainly consisting of lithium niobate.

The fundamental wave 2304 is converted into green light of wavelength 532 nm as its second harmonic wave (second harmonic wave 2305) in the wavelength conversion element 2301.

The fundamental wave light source 2401 is not limited to a fiber laser or alike. The fundamental wave light source 2401 may be a semiconductor laser, solid state laser excited by a semiconductor laser and alike.

If the wavelength conversion element 2301 is manufactured in such a manner that the non-wavelength-converting regions 2302 are exposed on the incidence surface 2306 and the emission surface 2307, it is less likely that the interaction length D between the wavelength conversion region 2303 and the fundamental wave 2304 fluctuates, which results in a more consistent wavelength allowance range.

Figure 16:
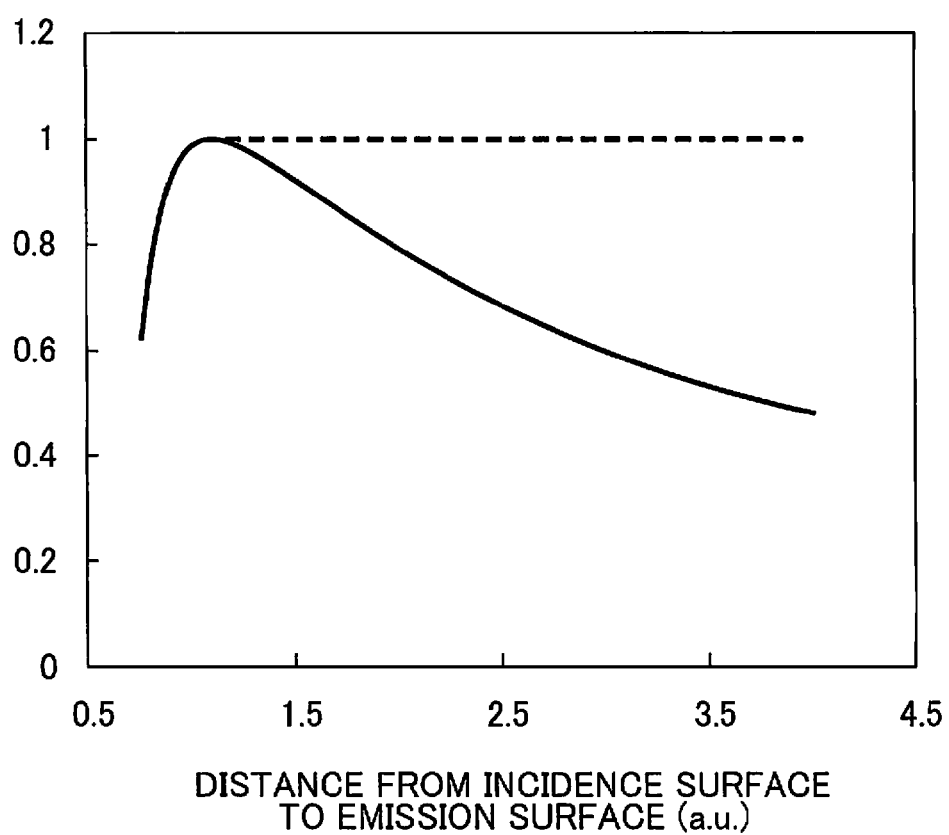
FIG. 16 shows relationships between wavelength allowance range and distance from the incidence surface to the emission surface of wavelength conversion laser light sources according to the prior art and the present invention.
Figure 17:
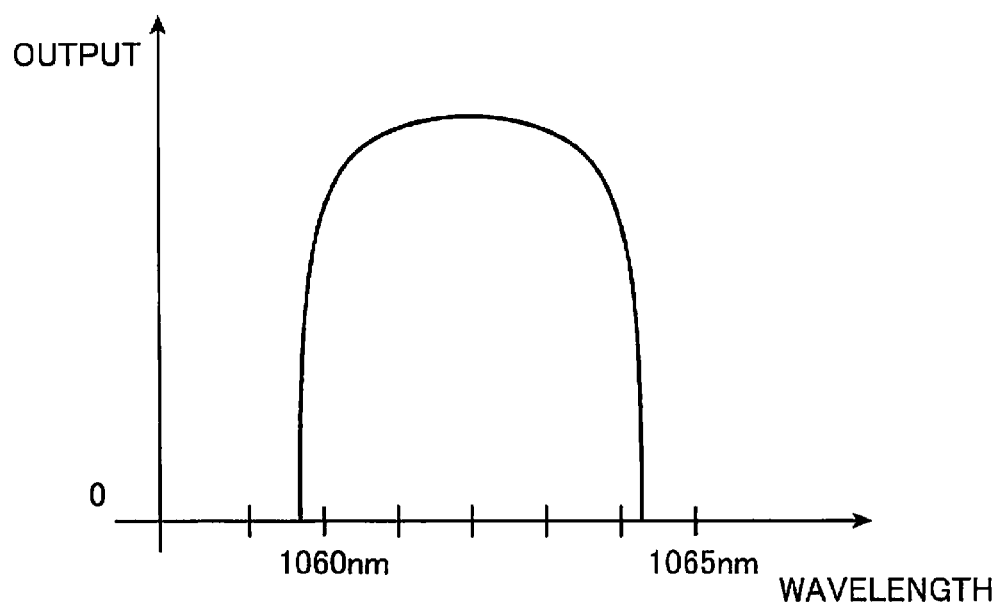
FIG. 17 exemplifies a fundamental wave spectral distribution in the wavelength conversion laser light source according to the present invention.

FIG. 16 shows relationships between the wavelength allowance range (wavelength range) and the distance from the incidence surface to the emission surface in a conventional wavelength conversion element 2701 and the wavelength conversion element 2301 according to the present invention. In the case of the conventional wavelength conversion element 2701, the interaction length D fluctuates due to end surface polishing. On the other hand, in the case of the wavelength conversion element 2301 according to the present invention, it is less likely that the interaction length D of the wavelength conversion element 2301 fluctuates because the non-wavelength-converting region 2302 is formed on both end surfaces or at lease one end surface. It should be noted that the wavelength conversion efficiency is less sensitive to an amount of the end surface polishing because a wavelength conversion amount of the fundamental wave is dramatically lower in the non-wavelength-converting regions 2302.

In short, the wavelength conversion efficiency becomes substantially consistent with any polished position of the non-wavelength-converting region.

FIG. 16 shows differences in characteristics between the conventional wavelength conversion element and the wavelength conversion element 2301 according to Embodiment 3. The horizontal axis represents ratios of lengths of the wavelength conversion region 2303 and the non-wavelength-converting region 2302, which are actually formed, to designed length for the wavelength conversion region 2303. It should be noted that the distance is defined as 1 unless the non-wavelength-converting region 2302 is formed. In order to make the description simpler, the non-wavelength-converting regions 2302 are formed on both end portions of the wavelength conversion region 2303, so that the distance from the incidence surface to the emission surface defined as 1 means absence of the non-wavelength-converting regions from both the incidence and emission surfaces.

In the conventional element, as indicated by the solid line in FIG. 16, the wavelength allowance range becomes a local maximum value if the distance from the light incidence surface 2306 to the emission surface 2307 with respect to the length of the wavelength conversion region 2303 is 1. Deviation from this distance means fluctuation of the interaction length D, which in turn leads to a narrower wavelength allowance range. On the other hand, in the case of the wavelength conversion element 2301 according to the present embodiment, as indicated by the dashed line in FIG. 16, if the distance from the incidence surface to the emission surface is 1 or greater, the interaction length D consistently becomes 1, which means a consistent wavelength allowance range. In short, if the cutting position is determined such that the average value of the distances from the incidence surface to the emission surface becomes 1.5 when the interaction length is, for example, 1, a desired wavelength allowance range is obtained under ±0.5 of fluctuation range of the distance from the incidence surface to the emission surface. If the distance from the incidence surface to the emission surface is longer than 3.75, the wavelength allowance range (dashed line 1602) according to the present invention becomes constant although it is not shown in FIG. 16. On the other hand, the wavelength allowance range (solid line 1601) according to the prior art becomes narrower if the distance from the incidence surface to the emission surface gets longer.

It should be noted that a range of the fundamental wave wavelength to achieve wavelength conversion efficiency more than half the maximum efficiency when the interaction length D is 1 is defined as the wavelength allowance range. In addition, it is assumed that there is no absorption of the fundamental wave or the second harmonic wave in the wavelength conversion element.

FIG. 23 shows the wavelength conversion region 2303 of which the polarization reversal walls are perpendicular to the incident direction of the fundamental wave 2304. Alternatively, the polarization reversal walls formed in the wavelength conversion region 2303 may be oblique with respect to the incident direction of the fundamental wave 2304 as described in the context of Embodiments 1 and 2. In this case, it is less likely that the wavelength conversion efficiency goes down in a prescribed wavelength range including the optimum wavelength.

Next, a method for forming the wavelength conversion element 2301 is exemplified. It should be noted that the wavelength conversion laser light source of FIG. 24 according to Embodiment 3 of the present invention, unlike the conventional wavelength conversion laser light source shown in FIG. 27, uses the wavelength conversion element, which is cut away from the nonlinear optical crystal substrate 2901 shown in FIG. 29.

Figure 30:
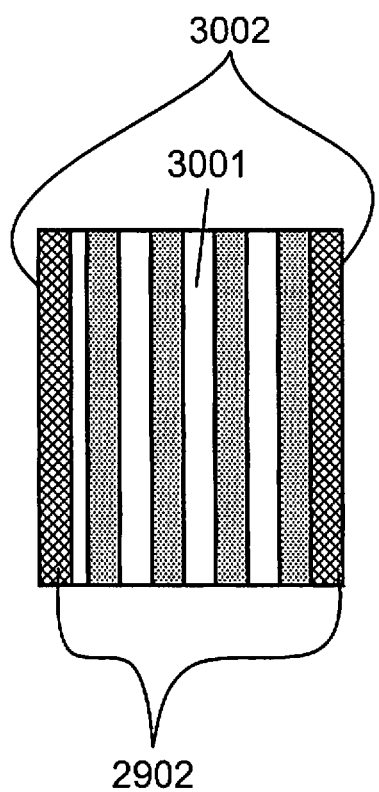
FIG. 30 shows schematic configuration of a nonlinear optical crystal substrate bit cut away from the nonlinear optical crystal substrate shown in FIG. 29.

The nonlinear optical crystal substrate 2901 has a structure including non-wavelength-converting regions 2902 (non-polarization reversal regions shown as oblique-line portions) in which a polarization reversal periodic structure is not formed. The nonlinear optical crystal substrate 2901 is cut within these non-wavelength-converting regions 2902 to be a separate nonlinear optical crystal substrate bit 3001 which includes non-wavelength-converting regions 2902 on two opposing cut surfaces 3002, as shown in FIG. 30.

The two opposing cut surfaces with the exposed non-wavelength-converting regions 2902 of this nonlinear optical crystal substrate bit 3001 is subjected to optical polishing to be the incidence surface 2306 and the emission surface 2307, and thereby the wavelength conversion element 2301 of FIG. 24 is obtained. Therefore the wavelength conversion element 2301 includes the non-wavelength-converting regions 2302 remaining between the incidence/emission surfaces 2306, 2307 and the wavelength conversion region 2303.

Figure 29:
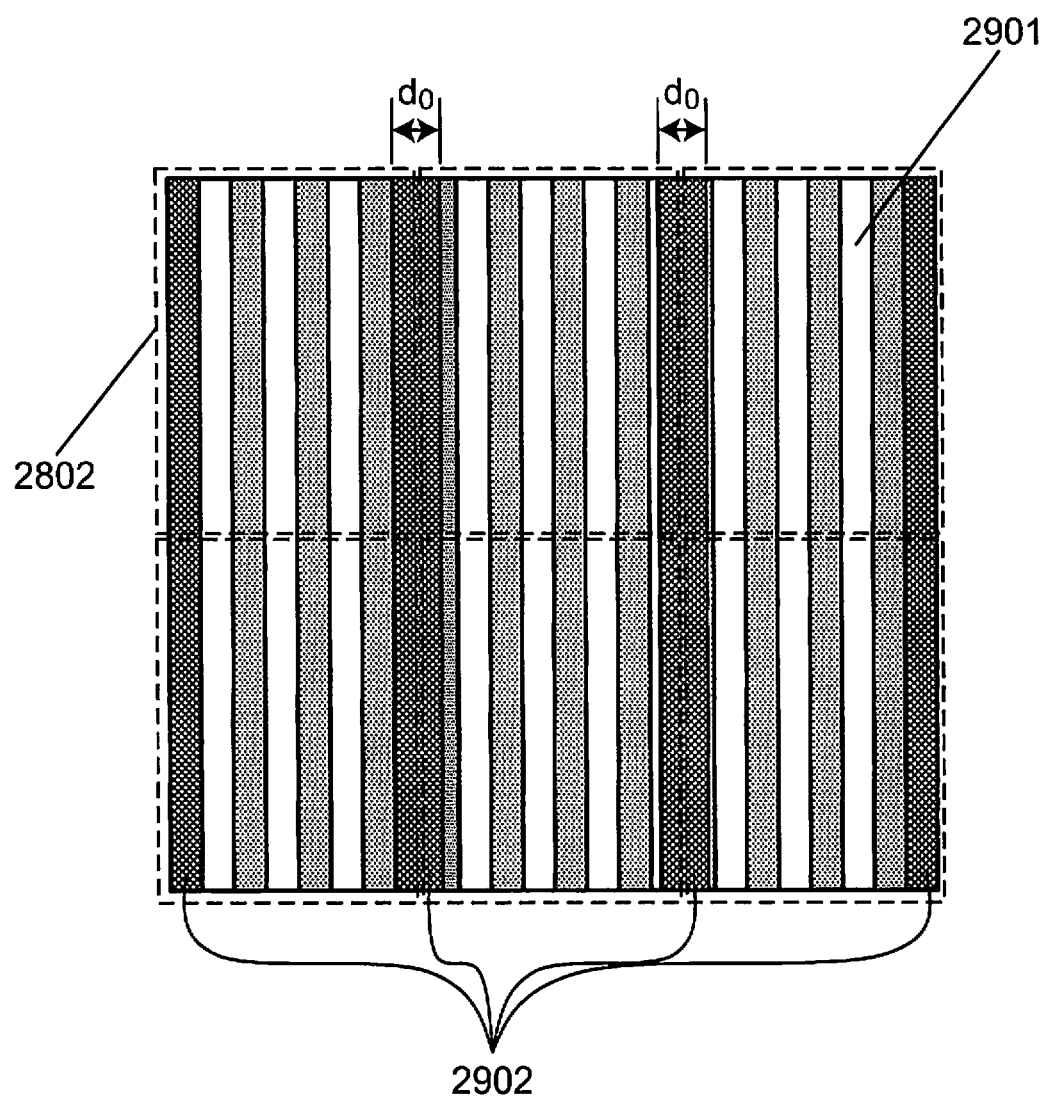
FIG. 29 shows schematic configuration of a nonlinear optical crystal substrate from which the wavelength conversion element according to the present invention is cut out.

Thus the non-wavelength-converting regions 2902 formed in the nonlinear optical crystal substrate 2901 shown in FIG. 29 are used as margins for cutting and polishing to obtain the wavelength conversion elements with the polished end surfaces according to this embodiment of the present invention. Even if distance between the finishing positions of the incidence and emission surfaces deviates in the non-wavelength-converting regions 2902, the designed wavelength allowance range is secured. The aforementioned advantageous result that an expected margin for the positional shifts of the incidence and emission surfaces are kept improves manufacturing yield and contributes to reduction in production costs.

The method for manufacturing the wavelength conversion element 2301 according to the present invention is not limited to the above method. Alternatively, the wavelength conversion region 2303 may be formed and thereafter bonded with the separate non-wavelength-converting regions 2302 to manufacture the wavelength conversion element 2301. In this case, the non-wavelength-converting regions 2302 and the wavelength conversion region 2303 may be bonded by a direct bonding manner. The bonding with the direct bonding method may decrease light reflection, so that it is less likely that the wavelength conversion becomes inefficient. Further alternatively, an optical film or alike may be interposed between the non-wavelength-converting regions 2302 and the wavelength conversion region 2303 to bond them together, or adhesive may be applied to bond them together in regions except for light transmission regions.

(Embodiment 4)

Yet another embodiment according to the present invention is described hereinafter with reference to the drawings.

Figure 26:
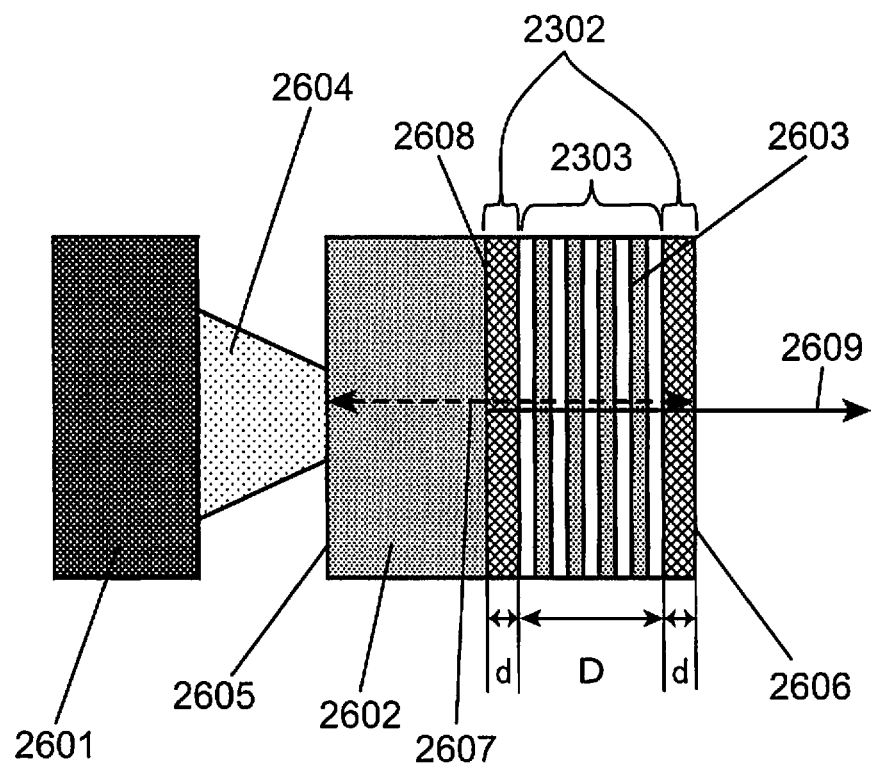
FIG. 26 shows schematic configuration of a wavelength conversion laser light source according to Embodiment 4 of the present invention.

FIG. 26 shows schematic configuration of the wavelength conversion laser light source according to Embodiment 4 of the present invention.

This configuration comprises a semiconductor laser 2601, solid-state laser crystals 2602 and a wavelength conversion element 2603. Pump light 2604 of wavelength 808 nm generated by the semiconductor laser 2601 excites the solid-state laser crystals 2602 including $YVO_4$ to which Nd is added to generate the fundamental wave 2607 of wavelength 1064 nm. A reflection prevention coating for pump light 2604, which works as a transmission prevention coating for the fundamental wave and the second harmonic wave as well, is formed on the incidence surface 2605 of the solid-state laser crystals 2602 on which the pump light 2604 is incident.

The opposite surface (the bonding surface 2608) to the incidence surface 2605 is subjected to hydrophilic treatment and then joined with the wavelength conversion element 2603 comprising lithium niobate, which has been similarly subjected to hydrophilic treatment, to obtain an optically bonded state. The wavelength conversion element 2603 has a transmission prevention coating for the fundamental wave 2607, which also works as a reflection prevention coating for the second harmonic wave. The transmission prevention coating for the fundamental wave 2607 is formed on the opposite surface (emission surface 2606) to the bonding surface 2608 bonded with the solid-state laser crystal 2602. Thus, the fundamental wave 2607 generated in the solid-state laser crystals 2602 resonates and oscillates between the transmission prevention coatings on the two surfaces (incidence surface 2605 and emission surface 2606), which interpose the solid-state laser crystal 2602 and wavelength conversion element 2603.

The wavelength conversion element 2603 according to the present embodiment also comprises a wavelength conversion region 2303 in which a periodic polarization reversal structure with period approximately 7 μm is formed to convert the fundamental wave 2607 into its second harmonic wave of wavelength 532 nm (the second harmonic wave 2609), which is then emitted outside the resonator from the emission surface 2606.

Like the wavelength conversion element 2301 according to Embodiment 3, the nonlinear optical crystal substrate 2901 comprising non-wavelength-converting regions 2902 (oblique-line portions), in which a polarization reversal periodic structure is not formed, is cut in the non-wavelength-converting regions 2902 and then polished to manufacture the wavelength conversion element 2603, as shown in FIG. 29. It should be noted that, according to the present invention, the bonding surface 2608 and the emission surface 2606 become two polished surfaces at this time. Therefore, the wavelength conversion element 2603 comprises the non-wavelength-converting regions 2302 free from a polarization reversal structure between the bonding/emission surface 2608, 2606 and wavelength conversion region 2303.

In this way, the non-wavelength-converting regions 2302 remain between the bonding surface 2608 and the wavelength conversion region 2303 and between the emission surface 2606 and the wavelength conversion region 2303. Therefore it is less likely to change the distance L to allow the wavelength conversion region 2303 to interact with the fundamental wave 2607, even if the cutting position shifts or a polished amount varies, so that the designed wavelength allowance range is obtained.

In the present embodiment, $YVO_4$ to which Nd is added is used as the solid-state laser crystals 2602. Alternatively another solid-state laser crystal material may be used to obtain similar advantageous results of the present invention. For example, $YVO_4$ to which Yb is added, YAG to which Nd or Yb is added, or alike may be used.

Other materials other than optical crystals may be used as a laser medium to obtain similar results. For example, YAG, $\{Gd_2Y\}Sc_2(Al_2Ga)O_{12}$, another ceramic material or alike may be used.

According to the aforementioned configuration, the YVO$_4$-based solid-state laser crystals 2602 are used. The YVO$_4$ is less different in refractive index from the wavelength conversion element 2603 (lithium niobate). Therefore, in the aforementioned configuration, there is less reflection of the fundamental wave 2607 or the second harmonic wave 2609 by Fresnel reflection without a dielectric multilayer film coating on the bonding surface 2608. However, optionally a reflection prevention coating for the fundamental wave 2607 may also be provided on the bonding surface 2608.

A semiconductor laser configured to emit the pump light 2604 of wavelength 880 nm may be used to excite the solid-state laser crystal 2602. In this case, the fundamental wave is more efficiently excited by the pump light, so that the laser light source preferably consumes less power.

According to the aforementioned configuration, the pump light 2604, the fundamental wave 2607 and the second harmonic wave are absorbed in the solid-state laser crystals 2602 and the wavelength conversion element 2603 to cause thermal lens effects, which in turn leads to an optical confinement effect in a direction perpendicular to the incidence surface 2605. The aforementioned configuration is preferably better at manufacturing an inexpensive laser light source. Optionally the aforementioned configuration may include a resonator configuration with concave and convex mirrors.

The resonator configuration with concave and convex mirrors makes a spread angle of the emitted second harmonic wave 2609 more stable. Therefore if the resonator configuration with concave and convex mirrors is employed to a light source for a laser scanning-type image display apparatus, the image display apparatus preferably forms finer images more stably.

In the above Embodiments 3 and 4, quasi-phase matched type wavelength conversion elements comprising a wavelength conversion region in which a periodic polarization reversal structure is formed and a non-wavelength-converting region without a polarization reversal structure are described. However, the configurations described in the context of the embodiments of this Description are merely examples. It should be understood that there may be various modifications without deviating from the gist of the present invention.

For example, the following remarks may be applied in common to both Embodiments 3 and 4.

First, according to Embodiments 3 and 4, the non-wavelength-converting region 2302 is defined as a region in which no polarization reversal structure is formed (the polarization direction was constant). It is less likely that a designed polarization reversal structure is formed at the boundary portion between a polarization reversal region, in which a polarization reversal structure is formed, and a region, in which a polarization reversal structure is not formed. This is because an electric field during forming the polarization reversal structure is concentrated at the boundary between the polarization reversal region and the region in which polarization reversal is not formed, so that it is likely that the reversal region at end portions extends. This may cause differences in length of the polarization reversal region from the design value, so that element characteristics may become deviated from the desired characteristics. Therefore it is preferable that the non-wavelength-converting region 2302 comprises a polarization reversal structure which does not contribute to wavelength conversion.

By this means, in a wavelength conversion region 2303, the designed polarization reversal structure is formed up to the boundary in contact with the non-wavelength-converting region, so that the wavelength conversion elements with higher wavelength conversion efficiency may be produced with much higher manufacturing yields.

A polarization reversal structure which does not contribute to wavelength conversion is exemplified hereinafter.

It should be noted that a non-wavelength-converting region does not mean a region in which a polarization reversal structure is not formed but means a region in which a polarization reversal structure configured not to contribute to wavelength conversion of the incident fundamental wave is formed.

Figure 31A:
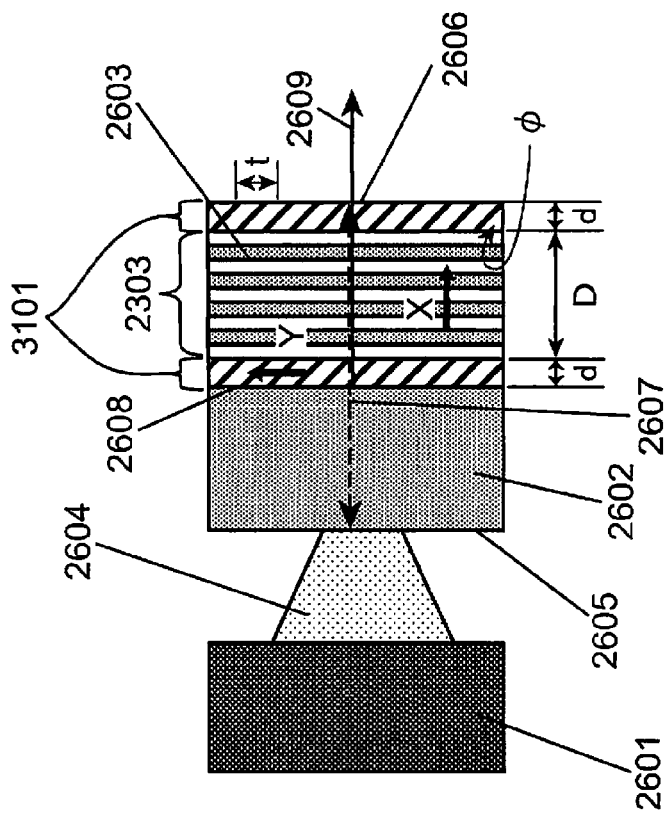
FIG. 31A shows schematic configuration of a wavelength conversion laser light source according to Embodiment 4 of the present invention.
Figure 31B:
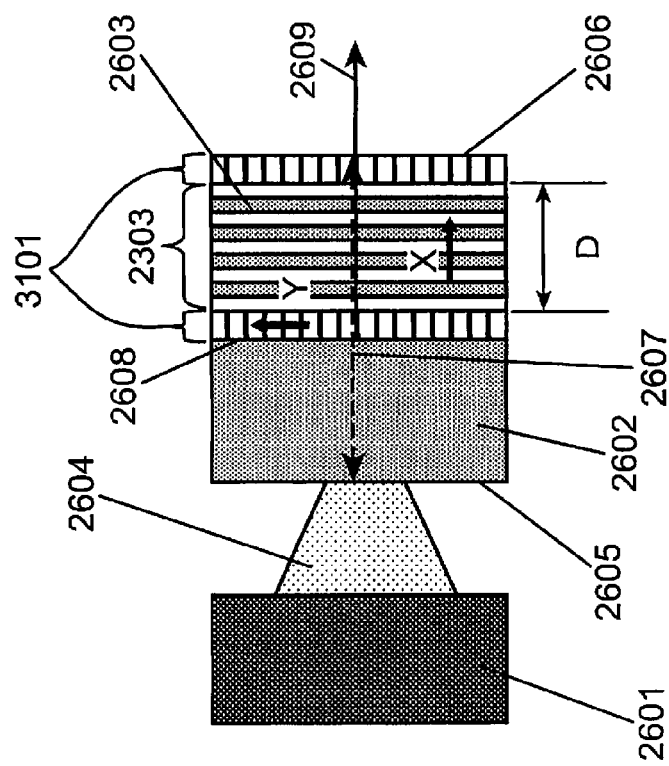
FIG. 31B shows another configuration of the wavelength conversion laser light source according to Embodiment 4 of the present invention.

For example, as shown in FIG. 31A, a region in which a polarization reversal structure is formed in a direction Y perpendicular to a direction X of periodic polarization reversal formed in the wavelength conversion region 2303 may be defined as the non-wavelength-converting region 3101 because the region does not contribute to wavelength conversion of an incident fundamental wave. It should be noted that the formation of the polarization reversal structure in the Y direction means that the polarization reversal wall (boundary at which the polarization is changed) is a plane perpendicular to a Y-direction vector. It should be also noted that it is not necessary that the polarization reversal structure of the non-wavelength-converting region 3101 is periodic. It is preferable that an angle between the Y direction and the polarization reversal wall is 75° or greater and also 105° or less because the second harmonic wave becomes much less sensitive to light converted by the non-wavelength-converting region 3101, so that similar advantageous result to the aforementioned perpendicular configuration may be preferably achieved. It should be noted that the second harmonic wave 2609 emitted from the wavelength conversion region 2303 is preferably emitted outside the wavelength conversion element without passing through polarization reversal walls of the polarization reversal structure formed in the non-wavelength-converting region 3101. For example, as shown in FIG. 31B, a polarization reversal structure having polarization reversal walls inclined by $\phi$ with respect to the direction of emission of the second harmonic wave may be formed in the wavelength conversion region 2303. In this case, it is preferable that the polarization reversal structure of the non-wavelength-converting region is configured to at least satisfy the relation $t \geq d \times \tan \phi$, where d is the width of the non-wavelength-converting region 3101 and t is the interval between polarization reversal walls.

Figure 32:
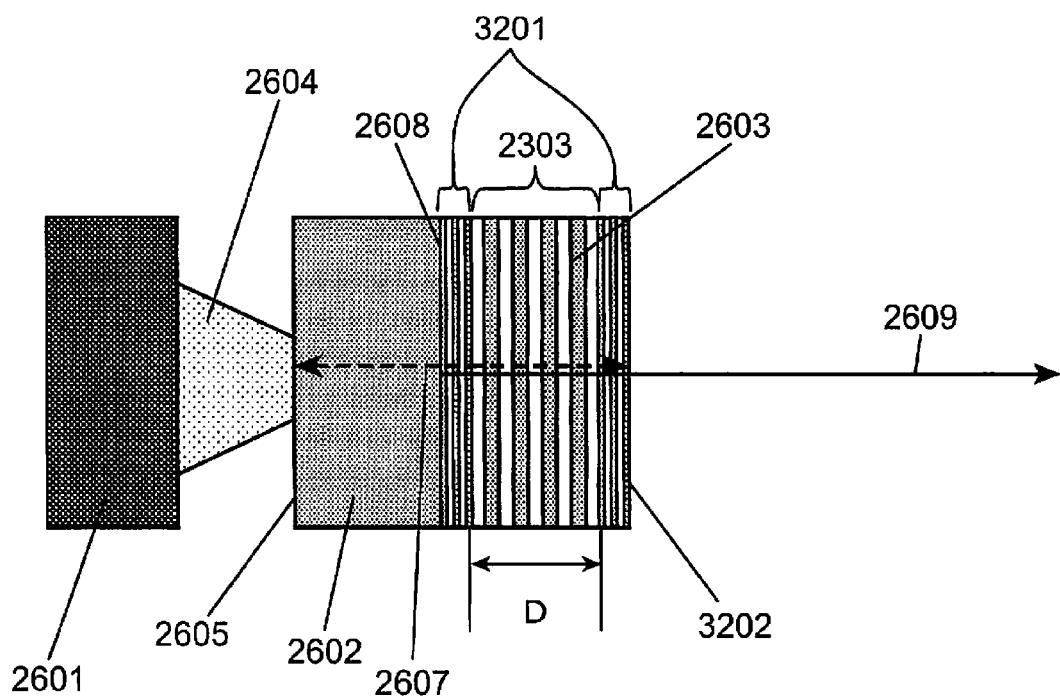
FIG. 32 shows schematic configuration of another wavelength conversion laser light source according to Embodiment 3 of the present invention.

As shown in FIG. 32, periodic polarization reversal structures may be formed in the same direction in both the wavelength conversion region 2303 and the non-wavelength-converting regions 3201 so that the polarization reversal periods of both regions satisfy the following relationship. In particular, if the wavelength conversion element 3202 comprising non-wavelength-converting regions 3201, in which periodic polarization reversal structures at 1/n (where n is a positive even integer) times the polarization reversal period formed in the wavelength conversion region is formed, is used, it is less likely that the second harmonic wave converted by the wavelength conversion region 2303 is further converted by the non-wavelength-converting region, which results in less variation in the wavelength allowance range compared with other configurations, for example, provided with a non-wavelength-converting region free from a polarization reversal structure.

It is more preferable to use a wavelength conversion element comprising a non-wavelength-converting region with a periodic polarization reversal structure at m/4 (where m is an odd integer equal to or greater than 3), s/2 (where s is an odd integer equal to or greater than 3), or u (where u is a positive even integer) times the polarization reversal period formed in the wavelength conversion region, which results in less variation in the wavelength allowance range compared with other configurations, for example, provided with a non-wavelength-converting region free from a polarization reversal structure.

The advantageous result of suppressing variation in the wavelength allowance range is ordered as follows among configurations having periodic polarization reversal structures in the same direction formed in both the wavelength conversion region 2303 and non-wavelength-converting regions 3201 with changing the polarization reversal period between both regions.

(1) a polarization reversal period of the non-wavelength-converting regions of 1/n times (where n is a positive even integer) with respect to the polarization reversal period of the wavelength conversion region: It should be noted that increase in the value of n results in more effective suppression of the variation.

(2) a polarization reversal period of the non-wavelength-converting regions of s/2 times (where s is an odd integer equal to or greater than 3) or u times (where u is a positive even integer) with respect to the polarization reversal period of the wavelength conversion region:

(3) a polarization reversal period of the non-wavelength-converting regions of m/4 times (where m is an odd integer equal to or greater than 3) with respect to the polarization reversal period of the wavelength conversion region: It should be noted that increase in the value of m results in less effective suppression of the variation.

It should be noted that increase in the period of the polarization reversal structure formed in a non-wavelength-converting region makes it easier to manufacture the non-wavelength-converting region 3201, which results in less production cost.

On the other hand, it is likely that larger difference between the polarization reversal periods of the wavelength conversion region and the non-wavelength-converting region results in departure from the designed polarization reversal structure in the boundary portion between the non-wavelength-converting region and the wavelength conversion region. In general, it is preferable that the polarization reversal structure is formed with a period of 5% or less of the thickness of the wavelength conversion element. If the thickness of the wavelength conversion element (width in the Y-axis direction) is 1 mm, then 50 μm or less is preferable. In this range, the electric field concentration is moderated so that it becomes easier to manufacture the designed polarization reversal structure. In particular, in this range, it becomes more practical to form the polarization reversal structure at the above-described boundary portion, which results in a much more efficient wavelength conversion element.

If the polarization reversal period of a non-wavelength-converting region 3201 is substantially the same as the above-described length, similar advantageous results of the present invention are obtained. Here, as a result of simulative calculations, "substantially the same" includes the following range. In particular, "substantially the same" means a range in which the polarization reversal period actually formed in the non-wavelength-converting region is 93.4% or greater and 107% or less with respect to the polarization reversal periods defined in the above (1) to (3). Advantageous results comparable to those of the present invention are obtained if the range in which the polarization reversal period actually formed in the non-wavelength-converting region is 7.7% or higher and 114% or lower.

It is preferable to take it into account that there is approximately 15 μm of variation in the position of the polished surface. It may be necessary to prepare a cutting margin of approximately 20 μm even if the cutting is performed with the commercially available thinnest blade of 15 μm in width. On the basis of the aforementioned consideration, the width d0 of the non-wavelength-converting region 2902 of the nonlinear optical crystal substrate 2901 shown in FIG. 29 is preferably at least 50 μm or greater to decrease production costs.

Further, in Embodiments 3 and 4 lithium niobate is used as the wavelength conversion element but the present invention is not limited to the configuration comprising the wavelength conversion element using lithium niobate. A wavelength conversion element comprising lithium tantalate, KTP, or another nonlinear optical material may be used to obtain similar advantageous results.

The quasi-phase matched wavelength conversion element with a periodic polarization reversal structure formed in the wavelength conversion region is used as the wavelength conversion element according to Embodiments 3 and 4. Alternatively a wavelength conversion element according the present invention may be a birefringent phase matched wavelength conversion element using birefringent phase matching as well. In this case, a wavelength conversion element in which a polarization reversal structure is not formed in the wavelength conversion region may be used. Contrary to a quasi-phase matched wavelength conversion element, in the case of a birefringent phase matched wavelength conversion element without a polarization reversal structure formed in the wavelength conversion region, a periodic polarization reversal structure may be formed in a non-wavelength-converting region to obtain advantageous results of the present invention. In this case, shorter period of the polarization reversal structure in the non-wavelength-converting region results in more effective suppression of variation in the wavelength allowance range.

Like Embodiments 1 and 2, it is preferable that the wavelength conversion element according to Embodiments 3 and 4 comprises several different polarization reversal regions in period to widen the oscillation wavelength range. Like Embodiments 1 and 2, it is preferable that the polarization reversal angle is different for each polarization reversal region. In particular, the sign (+/−) of odd-numbered and even-numbered polarization reversal angles counting from the incidence surface preferably alternates. At least two regions of the odd-numbered polarization reversal regions preferably have the same polarization reversal angle while at least two regions of the even-numbered polarization reversal regions have the same polarization reversal angle. If there is two polarization reversal regions with closer period, it is preferable that the two polarization reversal regions are not adjacent to each other. (The reasons and advantageous results are similar to those in Embodiment 1).

The wavelength conversion elements according to Embodiments 1 to 4 are configured to convert the fundamental wave of wavelength 1064 nm into the second harmonic wave of wavelength 532 nm, but the present invention is not limited to this configuration. Any laser light source configured to convert fundamental wave of any wavelength into harmonic wave, sum frequency wave or difference frequency wave thereof may use the present invention to obtain similar advantageous results. Any configuration for generating from fundamental waves with various wavelengths sum frequency waves and difference frequency waves thereof may obtain similar advantageous results by the present invention.

Figure 34:
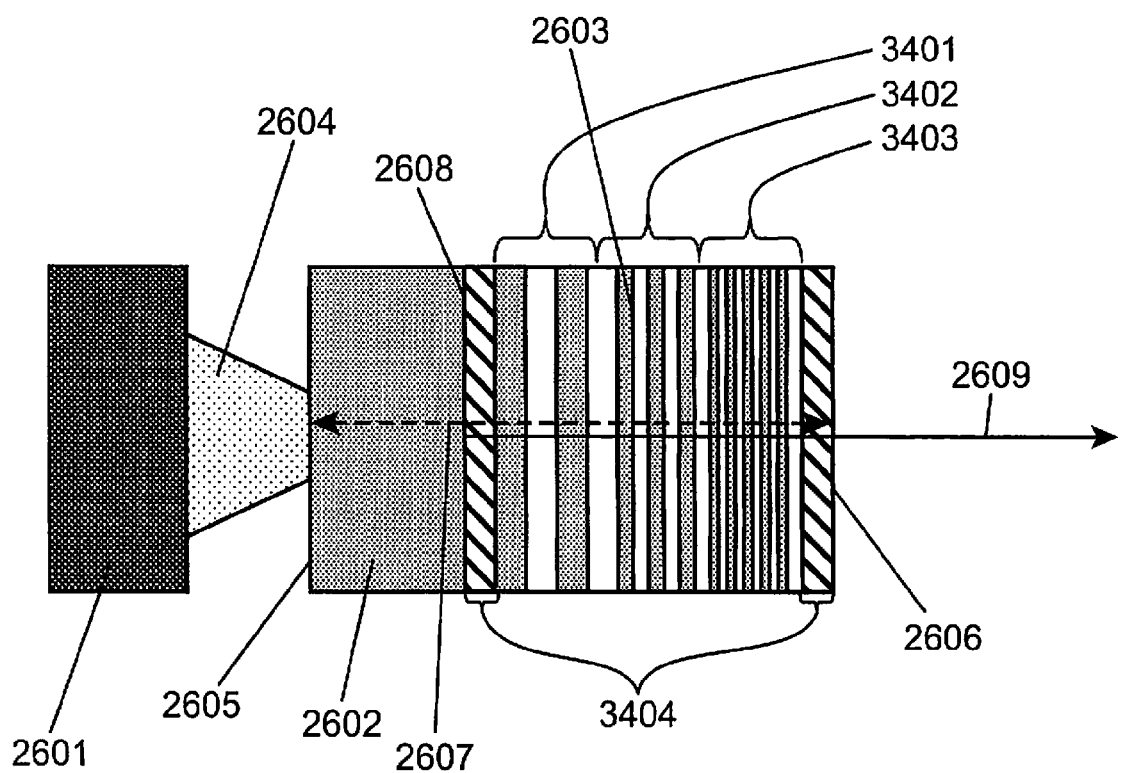
FIG. 34 shows schematic configuration of the wavelength conversion laser light source according to Embodiment 4 of the present invention.

The wavelength conversion elements according to Embodiments 3 and 4 comprise wavelength conversion regions 2303 in which polarization reversal structures with constant periods are formed. Alternatively, as shown in FIG. 34, the wavelength conversion element may preferably comprise wavelength conversion regions 3401, 3402, 3403 which have different polarization reversal period, respectively to widen the wavelength allowance range.

For example, periodic polarization reversal structures with periods of 6.95 µm, 6.93 µm, and 6.91 µm may be formed in the wavelength conversion regions 3401, 3402, 3403, respectively, to obtain the optimal interaction lengths of the wavelength conversion regions with the fundamental wave 2607, so that fundamental waves of wavelength 1060 nm to 1064 nm may be converted into the second harmonic waves.

Figure 36:
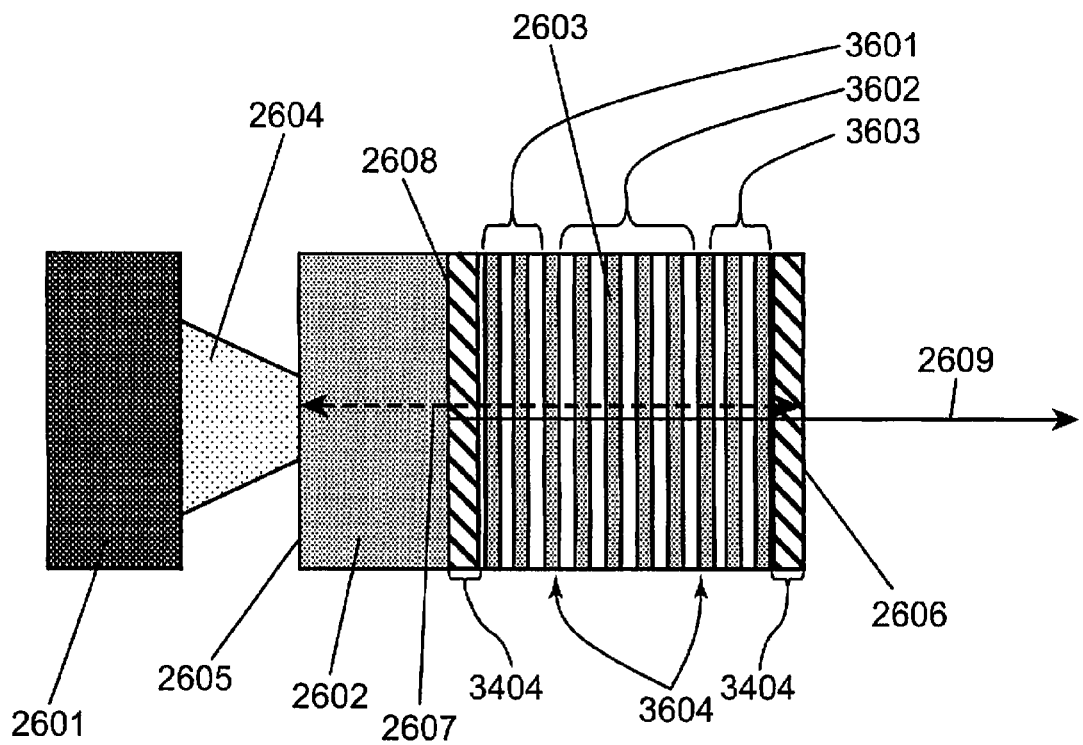
FIG. 36 shows schematic configuration of yet another wavelength conversion laser light source according to Embodiment 4 of the present invention.

As shown in FIG. 36, polarization reversal structures with a constant period may be formed in the wavelength conversion regions 3601, 3602, 3603 and combined with phase control regions 3604 to widen the wavelength allowance range and achieve a broader wavelength allowance range and higher efficiency.

It should be noted that the interaction lengths of the wavelength conversion regions 3601 and 3603 with the fundamental wave 2607 is, preferably, substantially the same. In addition, the combined interaction lengths of the fundamental wave 2607 with the two phase control regions 3604 is substantially an integral multiple of the polarization reversal period in the wavelength conversion region 3602. Such their combination may contribute to higher efficiency and a broader wavelength allowance range.

As aforementioned, the periodic structure of polarization reversals may be changed in chirped form to widen a range of acceptable phase matched wavelength for a broader wavelength allowance range.

It should be noted that the length of the wavelength conversion region becomes important for a single-period polarization reversal structure formed in a wavelength conversion region. The present inventor figured out that the designed wavelength allowance range may not be obtained even if there is the designed distance between incidence and emission surfaces (i.e., the length of the wavelength conversion region), by using a wavelength conversion element with inconsistent polarization reversal period of wavelength conversion regions and a wavelength conversion element including phase control portions (hereafter together called "wavelength conversion elements with the inconsistent polarization reversal period").

The present inventors searched the cause and identified new issues that if the wavelength conversion element is inconsistent in the polarization reversal period, even under a constant distance between incidence and emission surfaces, polishing process may change positions of these end surfaces, respectively, to cause departure from the designed wavelength allowance range.

For example, FIG. 36 shows the wavelength conversion laser light source comprising a phase control region. The interaction length from the phase control region between the wavelength conversion regions 3601, 3602 to the fundamental wave 2607 is set to 0.38 times the polarization reversal period of the wavelength conversion region 3602. The interaction length from the phase control region between the wavelength conversion regions 3603, 3602 to the fundamental wave 2607 is set to 0.62 times the polarization reversal period of the wavelength conversion region 3602. The interaction length between the wavelength conversion region 3601 and the fundamental wave 2607 is 75 µm. The interaction length between the wavelength conversion region 3602 and the fundamental wave 2607 is 350 µm.

Figure 37:
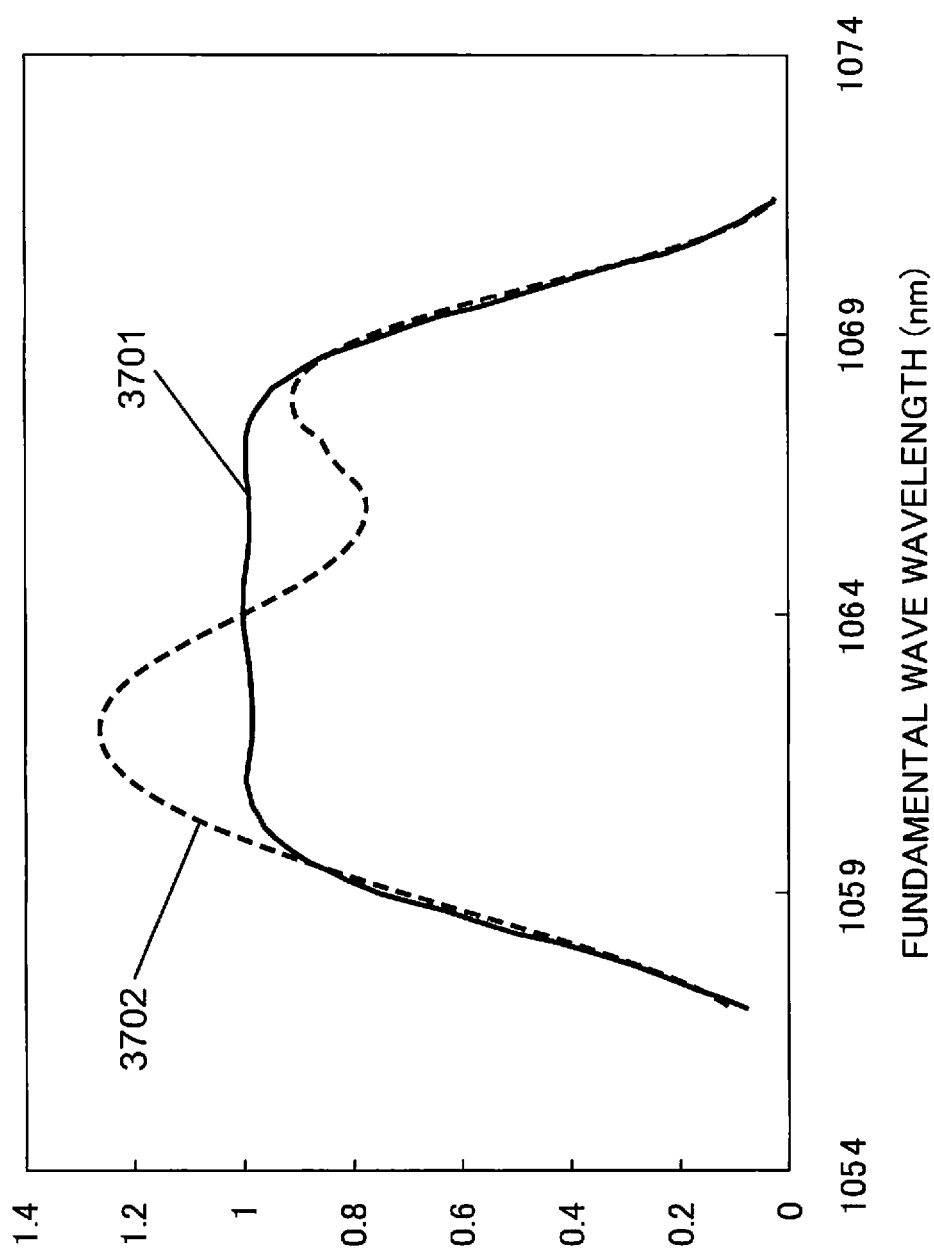
FIG. 37 shows a relationship between wavelength conversion efficiency and the fundamental wavelength of the wavelength conversion laser light source shown in FIG. 36.

If the bonding surface 2608 (which becomes the incidence surface according to this configuration) and the emission surface 2606 are set at the designed position, the wavelength conversion efficiency becomes uniform for fundamental wave wavelengths from 1060 nm to 1068 nm, as indicated by the solid line 3701 in FIG. 37. In case of a conventional configuration without a non-wavelength-converting region, shifts of the bonding surface and the emission surface by 25 µm in the same direction from the designed positions rapidly decrease the wavelength conversion efficiency of the solid line 3701 for fundamental waves of wavelength 1064 nm or greater even without change in the length of the wavelength conversion region, as indicated by the dashed line 3702 in FIG. 37.

Figure 33:
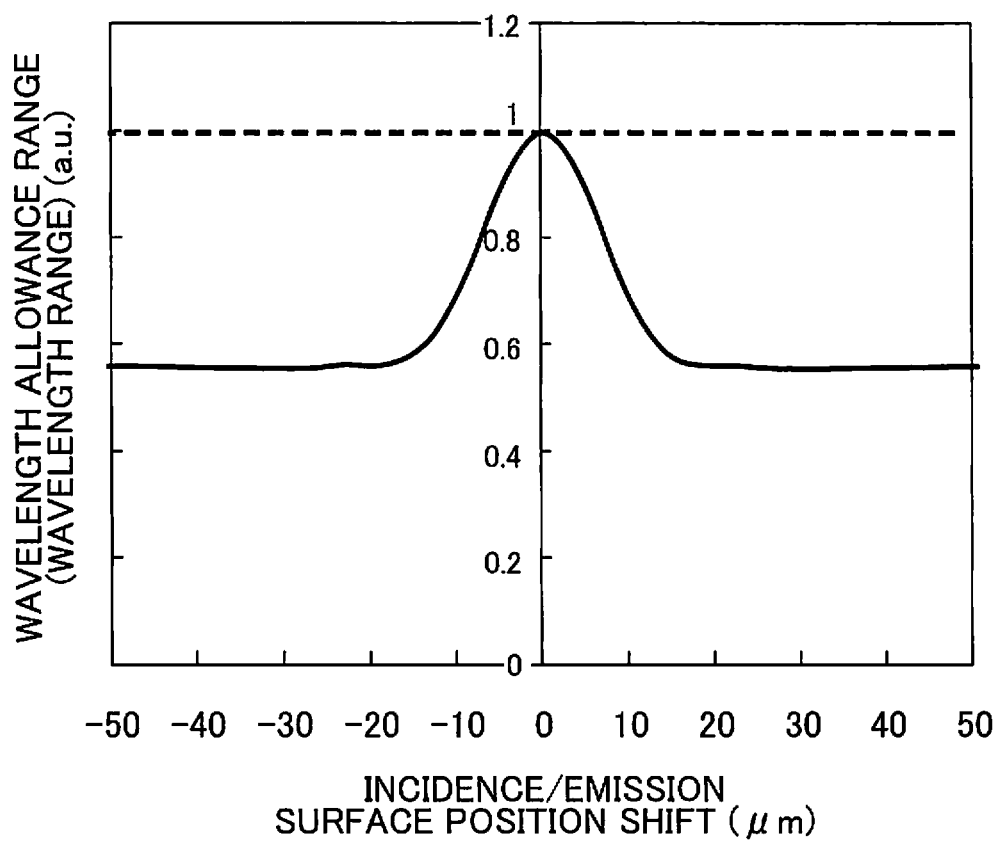
FIG. 33 shows relationships between wavelength allowance range and positional shifts of incidence/emission surfaces in the wavelength conversion laser light sources according to the prior art and the present invention.

In terms of a relationship between the wavelength allowance range and the positional shifts of the incidence and emission surfaces, as indicated by the solid line in FIG. 33, if the incidence and emission surface positions shift by 13 µm or more, the wavelength allowance range falls to 60% or less of the desired range. (It should be noted that the fundamental wave wavelength range for a wavelength conversion efficiency of 0.9 or higher in FIG. 37 is defined as the wavelength allowance range.)

As shown in FIG. 37, the central wavelength of the wavelength allowance range also changes, so that a light source for display using such a configuration may cause color shift and alike.

In order to overcome these new problems, in the case of a wavelength conversion element with the inconsistent wavelength conversion region polarization reversal period, it is preferable that the wavelength conversion element comprises non-wavelength-converting regions 3404, as shown in FIGS. 34 and 36.

By this means, as indicated by the dashed line in FIG. 33, the wavelength conversion element with the inconsistent wavelength conversion region polarization reversal period may achieve the designed wavelength allowance range if there are shifts in the positions of the incidence or emission surfaces.

It should be noted that the wavelength conversion element with the inconsistent wavelength conversion region polarization reversal period may preferably include a non-wavelength-converting region in which a polarization reversal structure is formed, in order to obtain the designed polarization reversal structure in the wavelength conversion region. Thus the wavelength conversion element may achieve more efficient wavelength conversion.

It is preferable that the area ratio of two regions with opposite polarization directions becomes 1:1 in at least regions where the fundamental wave transmits. By this means, it becomes less likely that shifts in the positions of the incidence and emission surfaces change the central wavelength of the wavelength allowance range. It should be noted that a range substantially the same as 1:1 is also preferable, where "substantially the same" means the range from 10:8 to 10:12.

In the cases of a wavelength conversion element with several different polarization reversal structures in period and a wavelength conversion element comprising a phase control region, it is more preferable to form a periodic polarization reversal structure with period 1/n (where n is a positive even integer) of the average polarization reversal period of the wavelength conversion region in non-wavelength-converting regions 3404.

By this means, it becomes less likely that the central wavelength of the wavelength allowance range changes.

FIGS. 31, 32, 34 and 36 show the other configurations according to Embodiment 4. Similar other configurations may be applied to Embodiment 3 as well.

Figure 35:
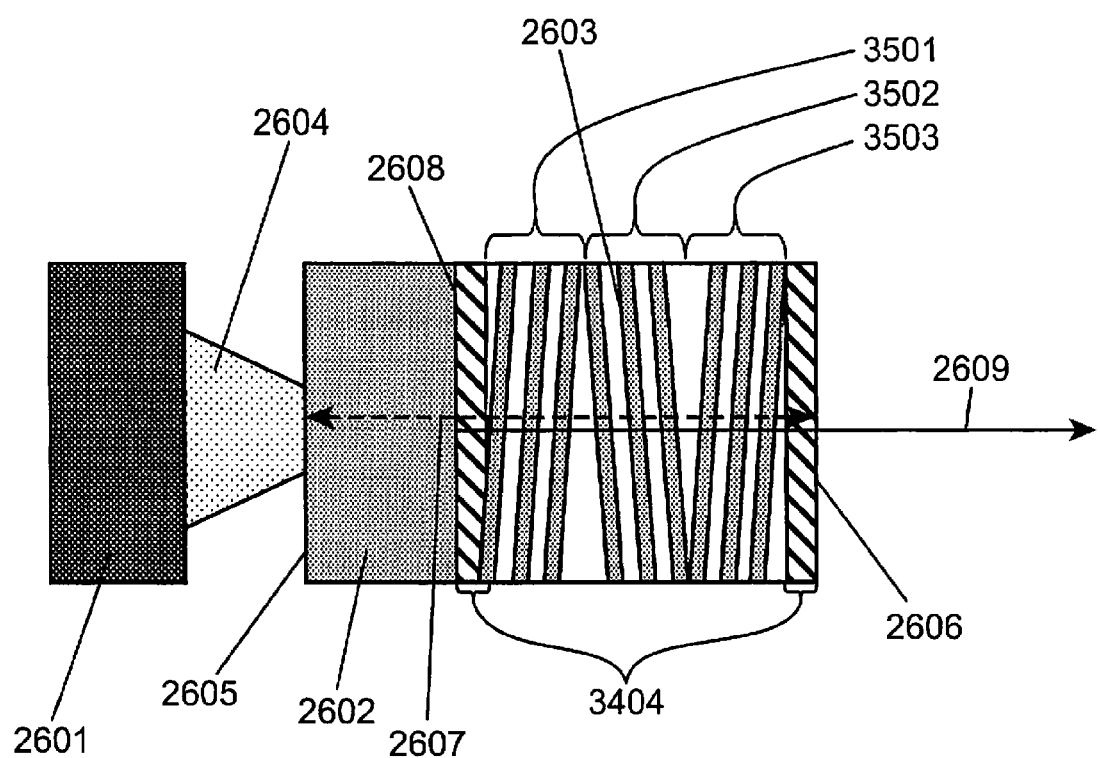
FIG. 35 shows schematic configuration of another wavelength conversion laser light source according to Embodiment 4 of the present invention.

In Embodiments 3 and 4, the polarization reversal walls of polarization reversal regions in a direction perpendicular to the incident direction of the fundamental wave are exemplified. Alternatively, polarization reversal regions may include oblique polarization reversal walls to the incident direction of the fundamental wave or other polarization reversal walls intersecting the incident direction of the fundamental wave at an angle other than the perpendicular direction. There may be several divided regions such as polarization reversal regions 3501, 3502, 3503 as shown in FIG. 35. At least two of these regions may include differently orientated polarization reversal walls.

It should be noted that the wavelength conversion laser light sources in Embodiments 3 and 4 are not limited to a particular structure, but may be fiber lasers, semiconductor lasers or alike.

The different configurations of wavelength conversion regions and non-wavelength-converting regions are exemplified in Embodiments 3 and 4. These configurations may be combined with the non-wavelength-converting regions and the wavelength conversion regions according to the other embodiments.

Apparatuses including the lithium niobate-based wavelength conversion elements are exemplified as the wavelength conversion laser light sources according to Embodiments 1 to 4. Wavelength conversion laser light sources including the wavelength conversion element mainly consists of lithium tantalate, KTP, or another nonlinear optical material may provide similar advantageous results.

(Embodiment 5)

Figure 14:
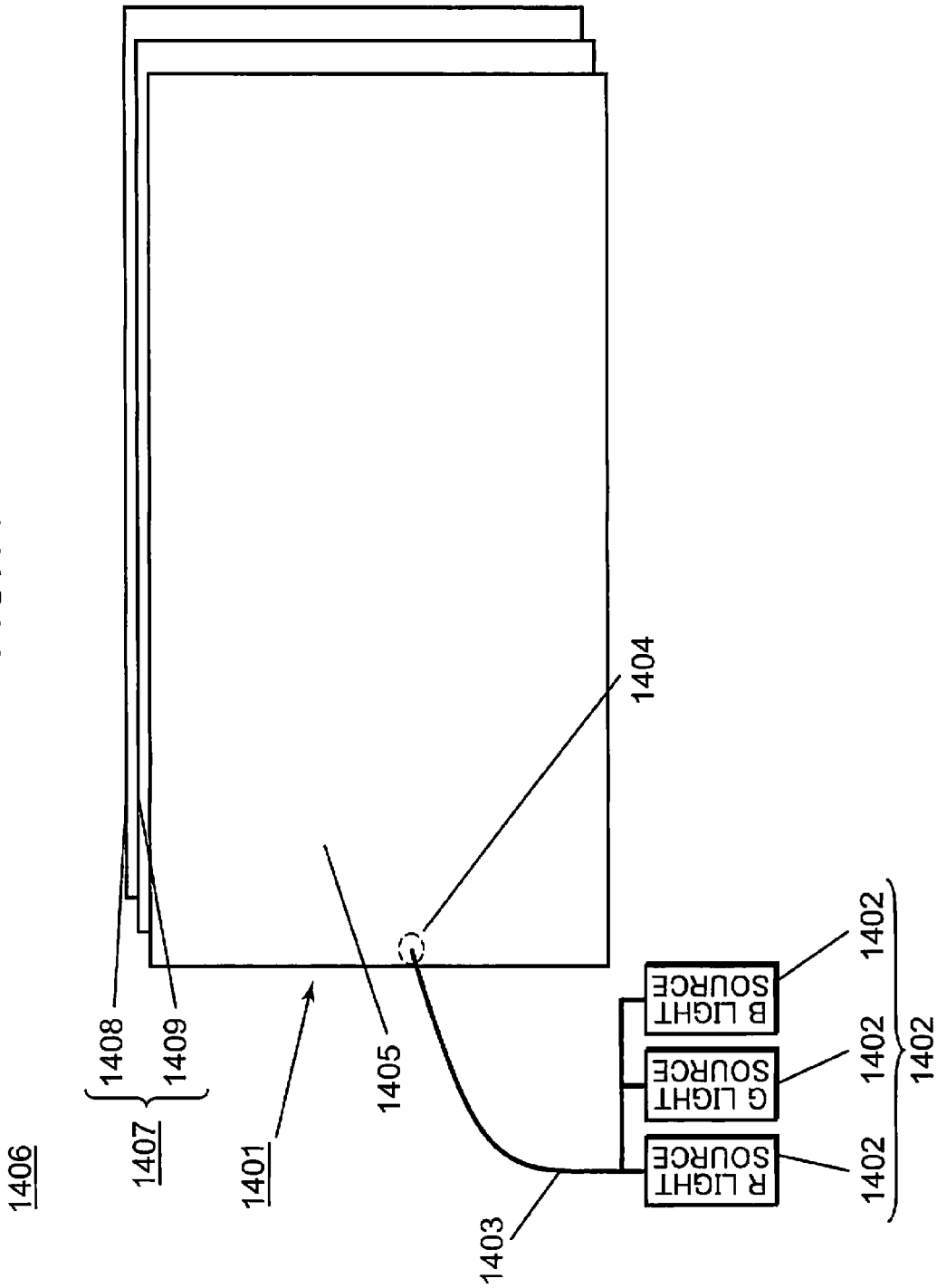
FIG. 14 exemplifies schematic configuration of an image display apparatus with the wavelength conversion laser light source according to the present invention.

FIG. 14 exemplifies schematic configuration of the image display apparatus according to Embodiment 5 of the present invention. The image display apparatus uses a backlight illumination device comprising the wavelength conversion laser light source according to Embodiments 1 to 4. A schematically depicted configuration of the liquid crystal display apparatus 1406 is exemplified as such an image display apparatus.

As shown in FIG. 14, the liquid crystal display apparatus 1406 comprises a liquid crystal display panel 1407 as a spatial modulation element, and a backlight illumination device 1401 configured to illuminate the liquid crystal display panel 1407 from the rear side. The light source of the backlight illumination device 1401 comprises several laser light sources 1402. The laser light sources 1402 includes light sources configured to emit at least red, green and blue light. In short, an R light source 1402a, a G light source 1402b and a B light source 1402c emit red, green, and blue laser light, respectively. The wavelength conversion laser light source described in the context of Embodiments 1 to 4 of the present invention is used as the G light source 1402b of these laser light sources 1402.

A semiconductor laser comprising AlGaInP/GaAs system material with a wavelength of 640 nm is used as the R light source 1402a while a semiconductor laser comprising GaN system material with a wavelength of 450 nm is used as the blue laser light source (B light source) 1402c.

Next, the schematic configuration of the liquid crystal display apparatus 1406 according to the present embodiment is described. The liquid crystal display apparatus 1406 according to the present embodiment comprises the backlight illumination device 1401 and the liquid crystal display panel 1407 including a polarization plate 1408 and a liquid crystal board 1409 which use the R, G and B laser light emitted from the backlight illumination device 1401 to display images. The backlight illumination apparatus 1401 according to the present embodiment comprises the laser light source 1402, an optical fiber 1403 configured to guide the R, G and B laser light from the laser light source 1402 together via a light-guiding portion 1404 to a light guide 1405, and the light guide 1405 configured to emit laser light from a principal face (not shown) uniformly filled with the guided R, G and B laser light.

The image display apparatus using a laser light source consumes less power to achieve excellent color reproducibility.

The liquid crystal display apparatus using a transmissive-type liquid crystal panel as a spatial modulation element is exemplified as an image display apparatus using a laser light source. Alternatively, a DMD mirror device or reflective LCOS device may be used as a spatial modulation element as well.

The optical fiber and light guide are exemplified as the optical system for the spatial modulation element. A projector using a lens optical system or other image display apparatus may be used to obtain similar advantageous results.

If the wavelength conversion laser light sources described in the context of Embodiments 1 to 4 is used as the green laser light source in these image display apparatuses, the image display apparatuses decreases output fluctuation.

Further, in this Description, configurations described in embodiments are merely examples, and it should be understood that there are various modifications without deviating from the gist of the present invention.

As described above, a wavelength conversion laser light source according to one aspect of the present invention has: a laser light source configured to generate fundamental wave laser light; and a wavelength conversion element provided with a periodic polarization reversal structure configured to convert the fundamental wave laser light which is incident onto the periodic polarization reversal structure into different laser light in wavelength, wherein the wavelength conversion element includes different polarization reversal regions in period; and a polarization reversal axis of at least one of the polarization reversal regions is inclined with respect to an incident optical path of the fundamental wave laser light on the wavelength conversion element.

According to the above configuration, the fundamental wave laser light generated by the laser light source is converted into different laser light in wavelength by the wavelength conversion element. The wavelength conversion element comprises different polarization reversal regions in period, which results in a broader wavelength allowance range and highly efficient wavelength conversion. The polarization reversal axis of at least one of the polarization reversal regions is inclined with respect to the incident optical path on the wavelength conversion element. It is likely that the formation of the periodic polarization reversal structure so that the polarization reversal axis is inclined with respect to the fundamental wave laser light optical path prevent "reconversion" which means that converted laser light generated from the fundamental wave laser light (e.g., the second harmonic wave and other wavelength-converted light) returns to the fundamental wave laser light in the wavelength conversion element, because if like the present invention a polarization reversal axis of a polarization reversal region is inclined with respect to the optical path of fundamental wave laser light, wavelength converted light converted from the fundamental wave laser light is generated in a propagation direction different from the fundamental wave laser light. Unless the propagation direction of the wavelength-converted light coincide with the propagation direction of the fundamental wave laser light, it is less likely that the phenomena in which the generated wavelength-converted light is reconverted into a fundamental wave as the difference frequency wave with the original fundamental wave laser light. Therefore it is likely that the prevention of "reconversion" into fundamental wave laser light from wavelength-converted light generated by the wavelength conversion element leads to reduction in wavelength conversion efficiency.

It should be noted that lowering of wavelength conversion efficiency due to the above "reconversion" (difference frequency wave generation) greatly depends on temperature, which is a significant factor to make output unstable because change in temperature may increases the proportion of change in the wavelength conversion efficiency. It is likely that the wavelength conversion laser light source according to the present invention effectively avoids the reduction in wavelength conversion efficiency due to "reconversion" as explained above and makes the output more stable. Thus if the wavelength conversion laser light source according to the present invention is applied to an image display, the display may display images with more stable brightness.

A wavelength conversion laser light source according to another aspect of the present invention has: an excitation laser light source configured to generate pump light; a resonator pair including solid-state laser crystals excited by the pump light to generate fundamental wave laser light; and a wavelength conversion element provided with a periodic polarization reversal structure configured to convert the fundamental wave laser light into different laser light in wavelength in the resonator pair, wherein a polarization reversal axis of the periodic polarization reversal structure is inclined with respect to an incident optical path of the fundamental wave laser light on the resonators; and a polarization reversal non-formation region, in which a polarization reversal structure is not formed, is provided between the solid-state laser crystals and the wavelength conversion element.

According to the above configuration, the solid-state laser crystals are excited by the pump light from the excitation laser light source to generate the fundamental wave laser light. The generated fundamental wave laser light is then converted into the different laser light in wavelength (a second harmonic wave or other wavelength-converted light) by the wavelength conversion element provided with the periodic polarization reversal structure in the resonators, which include the solid-state laser crystals. The periodic polarization reversal structure is formed such that the polarization reversal axis is inclined with respect to the optical path of the fundamental wave laser light incident on the resonators, so that the wavelength-converted light converted from the fundamental wave laser light is generated in a propagation direction different from that of the fundamental wave laser light. Unless the propagation direction of the wavelength-converted light coincide with the propagation direction of the fundamental wave laser light, it is likely that "reconversion", which means that converted laser light generated from the fundamental wave laser light (e.g., the second harmonic wave and other wavelength-converted light) returns to the fundamental wave laser light in the wavelength conversion element, is prevented. It is likely that the prevention of "reconversion" avoid reduction in the wavelength conversion efficiency, which results in more stable output.

The present inventor, however, figured out new issues of reduction in the wavelength conversion efficiency with time, which is caused when a polarization direction reverses in the plane of a wavelength conversion element directly bonded with solid-state laser crystals. The wavelength conversion laser light source according to the present invention includes the polarization reversal non-formation region, in which the polarization reversal structure is not formed. Thus it is less likely that the above reduction with time occurs.

In the above configuration, it is preferable that the wavelength conversion element comprises different polarization reversal regions in period.

By this means, the wavelength conversion laser light source according to the present invention may achieve a broader wavelength allowance range for wavelength of the fundamental wave laser light and more efficient wavelength conversion.

In the above configuration, it is preferable that the polarization reversal axis of at least one of polarization reversal regions is different from a polarization reversal axis of at least one of the other polarization reversal regions.

In this way, it is likely that existence of the different polarization reversal regions in polarization reversal axis in the wavelength conversion element effectively prevents unstable output resulting from the reconversion.

In the above configuration, it is preferable that a polarization reversal region which has a polarization reversal axis making a positive angle with an optical path of the laser light is formed adjacent to another polarization reversal region which has a polarization reversal axis making a negative angle with the optical path of the laser light.

According to the above configuration, the inclination of the polarization reversal axes in the adjacent polarization reversal regions becomes opposite directions to each other, so that a difference in polarization reversal angles of the adjacent polarization reversal regions (the angle made by the polarization reversal axis and the laser light optical path) gets larger. Therefore it is less likely that the wavelength-converted light is largely reconverted in the polarization reversal region immediately after the conversion from the fundamental wave laser light into different laser light in wavelength (the second harmonic wave or other wavelength-converted light), which results in more stable output obtained with smaller polarization reversal angles.

In the above configuration, it is preferable that the wavelength conversion element comprises polarization reversal regions which have polarization reversal axes making positive angles with an optical path of the laser light, respectively, and at least two polarization reversal angles among the polarization reversal regions coincide.

By this means, propagation directions of the wavelength-converted light generated by the wavelength conversion element are aligned, which allows reduction in the number of emission directions of laser light (wavelength-converted light) emitted from the wavelength conversion laser light source. Therefore the wavelength conversion laser light source to a projector or other image display apparatus, a projector or other image display apparatus may be allowed to have an inexpensive optical system with a simpler configuration.

Further, it is preferable that the wavelength conversion laser light source comprises a polarization reversal non-formation region between at least two adjacent polarization reversal regions among the polarization reversal regions.

According to the above configuration, the polarization reversal non-formation region exists between the adjacent polarization reversal regions (for example, a polarization reversal region $A_i$, and a downstream polarization reversal region $A_{i+1}$), so that the optical path of the wavelength-converted light generated in the polarization reversal region $A_i$, and the optical path of the fundamental wave laser light physically diverge while propagating through the polarization reversal non-formation region. This is because, as explained above, the propagation directions of the wavelength-converted light and the fundamental wave laser light are different. Therefore broader interval between the optical paths of the wavelength-converted light and the fundamental wave laser light than interval under absence of the polarization reversal non-formation region may be allowed to weaken interaction between the wavelength-converted light and the fundamental wave laser light, which results in less reconversion aforementioned.

In the above configuration, it is preferable that the solid-state laser crystals and the wavelength conversion element are directly bonded, and the polarization reversal non-formation region is formed at a bonding surface between the wavelength conversion element and the solid-state laser crystals.

In this way, by forming the polarization reversal non-formation region at the bonding surface of the wavelength conversion element with the solid-state laser crystal to directly bond the solid-state laser crystal to the wavelength conversion element, manufacture of the wavelength conversion laser light source becomes much easier, and the wavelength conversion laser light source becomes more compact and inexpensive.

In the above configuration, it is preferable that the wavelength conversion element comprises lithium niobate-based crystals, and an angle made by a polarization reversal axis of at least one of the polarization reversal regions and an optical path of the laser light is 2.9° or greater and 14.6° or less.

By this means, it is likely that the wavelength conversion element comprising lithium niobate-based crystal prevents the reconversion of generated wavelength-converted light into the fundamental wave as a difference frequency wave with the fundamental wave laser light may be effectively prevented and the reduction in the wavelength conversion efficiency, which results in more stable output.

Further, it is preferable that the wavelength conversion element comprises a lithium tantalite-based crystal, and an angle made by a polarization reversal axis of at least one of the polarization reversal regions and an optical path of the laser light is 3.3° or greater and 16.6° or less.

By this means, it is likely that the wavelength conversion element comprising lithium tantalite-based crystal prevents the reconversion of generated wavelength-converted light into the fundamental wave as a difference frequency wave with the fundamental wave laser light can be effectively prevented and the reduction in the wavelength conversion efficiency, which results in more stable output.

A wavelength conversion laser light source according to yet another aspect of the present invention has: a laser light source configured to generate fundamental wave laser light; and a wavelength conversion element including a wavelength conversion region configured to convert the fundamental wave laser light incident from the laser light source into different laser light in wavelength, wherein the wavelength conversion element has optically polished end surfaces configured to transmit or reflect the fundamental wave laser light; and a non-wavelength-converting region for the wavelength of the fundamental wave laser light is provided between at least one of the optically polished end surfaces and the wavelength conversion region.

According to the above configuration, the fundamental wave laser light generated by the laser light source is converted into different laser light in wavelength by the wavelength conversion region of the wavelength conversion element. The wavelength conversion element has optically polished end surfaces each of which transmits or reflects the fundamental wave laser light. The non-wavelength-converting region with respect to the wavelength of the fundamental wave laser light is formed between the end surface and the wavelength conversion region. Therefore even when a distance between the optically polished end surfaces in the wavelength conversion element (for example, the distance from the incidence surface to the emission surface of the wavelength conversion element) deviates from a desired distance, the wavelength conversion element with the desired wavelength allowance range may be realized. That is, at least one among the optically polished end surfaces in the wavelength conversion element is a non-wavelength-converting region, in which wavelength-converted amount of the fundamental wave laser light is dramatically reduced, so that the interaction length between the wavelength conversion region and the fundamental wave laser light is less likely to vary, even if the distance between end surfaces in the wavelength conversion element changes because of the end surface polishing. Therefore the wavelength conversion efficiency becomes much less sensitive to any polished position of the non-wavelength-converting region and likely to be more consistent.

In the above configuration, it is preferable that the laser light source generates fundamental wave laser light having wavelength peaks, and the wavelength conversion element exhibits temperature characteristics so that conversion efficiency from the fundamental wave laser light to the different laser light in wavelength has local maximum values if the fundamental wave laser light has a single wavelength.

According to the above configuration, the temperature characteristics of the conversion efficiency of the wavelength conversion element has local maximum values for the fundamental wave laser light with a single wavelength, so that there are peaks and valleys in the temperature characteristics. In this case, the laser light source configured to generate the fundamental wave laser light having wavelength peaks is used. Therefore, the fundamental wave laser light having the wavelength peaks is wavelength-converted by the wavelength conversion element having the above temperature characteristics, so that the peaks and valleys of the temperature characteristics are moderated, which results in less change in the wavelength conversion efficiency than when single-wavelength fundamental wave laser light is made incident on the wavelength conversion element.

Further, it is preferable that different polarization reversal regions in period within the wavelength conversion region.

The wavelength conversion element comprising polarization reversal regions in this way may achieve both a broader wavelength allowance range with respect to the wavelength of fundamental wave laser light and more efficient wavelength conversion.

Further, it is preferable that a phase control region in the wavelength conversion region.

By this means, both a broader wavelength allowance range with respect to the wavelength of fundamental wave laser light and more efficient wavelength conversion may be achieved.

Further, it is preferable that when temperatures at which the wavelength conversion efficiency becomes local maximum values are represented by p (° C.), a wavelength interval of fundamental wave laser light having wavelength peaks is represented by $\Delta\lambda$ (nm), and q is any arbitrary natural number, a following relationship is established:

$$(0.033+0.067 \times p) \times q > \Delta\lambda > (-0.033+0.67 \times p) \times q.$$

Such limitation of the wavelength interval $\Delta\lambda$ of fundamental wave laser light having wavelength peaks may reduce change in the wavelength conversion efficiency to half or less compared with the case in which single-wavelength fundamental wave laser light is made incident on the wavelength conversion element.

Further, it is preferable that the non-wavelength-converting region is formed at both two end surfaces of the wavelength conversion region, each of which transmits or reflects the fundamental wave laser light.

Such formation of the non-wavelength-converting region at two end surfaces of the wavelength conversion region reduces change in the interaction length between the wavelength conversion region and the fundamental wave laser light even when the distance between end surfaces in the wavelength conversion element is changed by end surface polishing, which results in more stable wavelength conversion efficiency.

Further, it is preferable that the wavelength conversion element is a birefringent phase matched wavelength conversion element in which a polarization reversal direction of the wavelength conversion region is consistent, and a polarization reversal structure is provided in the non-wavelength-converting region.

In this way, the birefringent phase matched wavelength conversion element in which the polarization reversal direction of the wavelength conversion region is constant may be used. In this case, by forming a polarization reversal structure in the non-wavelength-converting region, advantageous effects of the present invention may be obtained.

Further, it is preferable that a polarization reversal structure is formed in the non-wavelength-converting region so that an area ratio of two regions of which polarization directions are opposite to each other is from 10:8 to 10:12.

By this means, it is less likely that the central wavelength of the wavelength allowance range is changed by positional shift of the incidence or emission surfaces of the wavelength conversion element.

Further, it is preferable that a length of closer one of the two non-wavelength-converting regions to the laser light source is represented by d1, a length of farther one of the two non-wavelength-converting regions to the laser light source is represented by d2, and a relation d1>d2 is satisfied.

The above configuration is appropriate, for example, for the purpose of reducing loss of wavelength-converted light (second harmonic wave) emitted from the wavelength conversion element and increasing output. Extension in the length d1 of the non-wavelength-converting region long decreases probability of changing the interaction length between the wavelength conversion region and the fundamental wave laser light due to end surface polishing, which result in more stable performance of the wavelength conversion element. On the other hand, extension in the length d2 of the non-wavelength-converting region on the emission side results in more losses in the emitted wavelength-converted light. Therefore the length d2 is set to be shorter than d1 to achieve both the stability of the element performance and less losses of wavelength-converted light.

Further, it is preferable that a length of closer one of the two non-wavelength-converting regions is represented by d1, a length of farther one of the two non-wavelength-converting regions is represented by d2, and a relation d1<d2 is satisfied.

The above configuration is appropriate, for example, when power of the fundamental wave laser light incident on the wavelength conversion element is higher. If the power of the fundamental wave laser light is higher, thermal lens effect caused by a lot of absorption of the fundamental wave laser light in the non-wavelength-converting region of length d1 may degrade the beam qualities. Therefore greater power of the fundamental wave laser light is expected, d1 may be shorter than d2, so that it is less likely that the beam quality degrades. In addition, the length of the non-wavelength-converting region may be secured on the emission side of the wavelength conversion element to stabilize performance of the element.

In the wavelength conversion laser light source according to yet another aspect of the present invention, it is preferable that a polarization reversal structure is formed in the non-wavelength-converting region, and, when an angle made by a direction of light incident on the non-wavelength-converting region and a polarization reversal wall of the polarization reversal structure formed in the non-wavelength-converting region is represented by $\theta$, a width of the non-wavelength-converting region is represented by d, and an interval between adjacent polarization reversal walls is represented by t, at least a relation $t \geq d \tan \theta$ is satisfied.

As aforementioned above, if the polarization reversal structure is formed in the above non-wavelength-converting region, the wavelength-converted light generated in the wavelength conversion element (the second harmonic wave) may be emitted outside the wavelength conversion element without passing through the polarization reversal wall of the polarization reversal structure formed in the non-wavelength-converting region, by forming the polarization reversal structure so as to satisfy the above condition equation. Therefore the effect on the wavelength-converted light emitted from the wavelength conversion element may be suppressed even when a polarization reversal structure is formed in the non-wavelength-converting region.

The wavelength conversion laser light source according to yet another aspect of the present invention comprises an excitation laser light source; a resonator pair provided with solid-state laser crystals configured to generate fundamental wave laser light, and a wavelength conversion element provided with a periodic polarization reversal structure configured to convert the fundamental wave laser light in the resonator into different laser light in wavelength, wherein the wavelength conversion element comprises a lithium niobate-based crystals, and the polarization reversal structure is formed such that a polarization reversal axis therein is inclined with respect to an incident optical path of the fundamental wave laser light on the resonators, and an angle made by the polarization reversal axis of at least one of the polarization reversal regions and the optical path of the laser light is 2.9° or greater and 14.6° or less.

According to the above configuration, "reconversion", in which wavelength-converted light generated by the wavelength conversion element returns to fundamental wave light, may be effectively prevented, which results in more stable output.

The image display apparatus according to yet another aspect of the present invention comprises laser light sources; a spatial modulation element; and an optical system configured to guide light emitted from the laser light sources to the spatial modulation element, wherein the laser light sources emit at least red, green and blue light respectively; and at least the laser light source emitting green light among the laser light sources is the wavelength conversion laser light source according to any one of the aforementioned configurations.

In this way, in the image display apparatus employing the spatial modulation element, by using one of the wavelength conversion laser light sources according to the present invention as the green laser light source, the image display apparatus may display better quality image with more stable brightness.

The image display apparatus according to yet another aspect of the present invention comprises laser light sources; a scanning portion configured to scan the laser light sources; and an optical system configured to guide light emitted from the laser light sources to the scanning portion, wherein the laser light sources emit at least red, green and blue light respectively; and at least the laser light source which emits green light among the laser light sources is the wavelength conversion laser light source according to any one of the aforementioned configurations.

In this way, in the image display apparatus employing the spatial modulation element, by using one of the wavelength conversion laser light sources according to the present invention as the green laser light source, the image display apparatus may display better quality image with stable brightness.

The specific embodiments or examples described in modes to deploy the present invention are merely to clarify the technical content of the present invention, and are not to be understood narrowly as limited only to these specific examples, and various modifications may be made within the spirit of the present invention and the scope of claims.

Industrial Applicability

A wavelength conversion laser light source according to the present invention may suppress output fluctuations due to reconversion. As a result, the wavelength conversion laser light source may make stable output.

By using the wavelength conversion laser light source according to the present invention, an image display apparatus which exploits such better characteristics of laser light as compactness and lower power consumption may suppress output fluctuation.

The invention claimed is:

1. A wavelength conversion laser light source, comprising:
a laser light source configured to generate fundamental wave laser light; and
a wavelength conversion element including a wavelength conversion region configured to convert the fundamental wave laser light incident from the laser light source into different laser light in wavelength, wherein
the wavelength conversion element has optically polished end surfaces configured to transmit or reflect the fundamental wave laser light; and
a non-wavelength-converting region for the wavelength of the fundamental wave laser light is provided between at least one of the optically polished end surfaces and the wavelength conversion region, and
the wavelength conversion element is a birefringent phase matched wavelength conversion element in which a polarization reversal direction of the wavelength conversion region is consistent, and
a polarization reversal structure is provided in the non-wavelength-converting region.

2. The wavelength conversion laser device according to claim 1, wherein
the laser light source generates fundamental wave laser light having wavelength peaks, and
the wavelength conversion element exhibits temperature characteristics so that conversion efficiency from the fundamental wave laser light to the different laser light in wavelength has local maximum values if the fundamental wave laser light has a single wavelength.

3. The wavelength conversion laser light source according to claim 1, comprising different polarization reversal regions in period within the wavelength conversion region.

4. The wavelength conversion laser light source according to claim 1, comprising a phase control region in the wavelength conversion region.

5. The wavelength conversion laser light source according to claim 2, wherein, when temperatures at which the wavelength conversion efficiency becomes local maximum values are represented by p (° C.), a wavelength interval of fundamental wave laser light having wavelength peaks is represented by $\Delta\lambda$ (nm), and q is any arbitrary natural number, a following relationship is established:

$$(0.033+0.067\times p)\times q > \Delta\lambda > (-0.033+0.67\times p)\times q.$$

6. The wavelength conversion laser light source according to claim 1, wherein the non-wavelength-converting region is formed at both two end surfaces of the wavelength conversion region, each of which transmits or reflects the fundamental wave laser light.

7. The wavelength conversion laser light source according to claim 1, wherein a polarization reversal structure is formed in the non-wavelength-converting region so that an area ratio of two regions of which polarization directions are opposite to each other is from 10:8 to 10:12.

8. The wavelength conversion laser light source according to claim 6, wherein
a length of closer one of the two non-wavelength-converting regions to the laser light source is represented by d1,
a length of farther one of the two non-wavelength-converting regions to the laser light source is represented by d2, and
a relation d1>d2 is satisfied.

9. The wavelength conversion laser light source according to claim 6, wherein
a length of closer one of the two non-wavelength-converting regions is represented by d1,
a length of farther one of the two non-wavelength-converting regions is represented by d2, and
a relation d1<d2 is satisfied.

10. The wavelength conversion laser light source according to claim 9, wherein
when an angle made by a direction of light incident on the non-wavelength-converting region and a polarization reversal wall of the polarization reversal structure formed in the non-wavelength-converting region is represented by $\theta$, a width of the non-wavelength-converting region is represented by d, and an interval between adjacent polarization reversal walls is represented by t, at least a relation $t \geq d \tan\theta$ is satisfied.

11. The wavelength conversion laser light source according to claim 1, wherein
the wavelength conversion element includes different polarization reversal regions in period; and
a polarization reversal axis of at least one of the polarization reversal regions is inclined with respect to an incident optical path of the fundamental wave laser light on the wavelength conversion element.

12. The wavelength conversion laser light source according to claim 11, wherein the wavelength conversion element comprises different polarization reversal regions in period.

13. The wavelength conversion laser light source according to claim 11, wherein the polarization reversal axis of at least one of polarization reversal regions is different from a polarization reversal axis of at least one of the other polarization reversal regions.

14. The wavelength conversion laser light source according to claim 13, wherein, in the wavelength conversion region, a polarization reversal region which has a polarization reversal axis making a positive angle with an optical path of the laser light is formed adjacent to another polarization reversal region which has a polarization reversal axis making a negative angle with the optical path of the laser light.

15. The wavelength conversion laser light source according to claim 14, wherein
the wavelength conversion element comprises polarization reversal regions which have polarization reversal axes making positive angles with an optical path of the laser light, respectively, and
at least two polarization reversal angles among the polarization reversal regions coincide.

16. The wavelength conversion laser light source according to claim 11, comprising a polarization reversal non-formation region between at least two adjacent polarization reversal regions among the polarization reversal regions.

17. The wavelength conversion laser light source according to claim 11, wherein
the wavelength conversion region of the wavelength conversion element comprises lithium niobate-based crystals, and
an angle made by a polarization reversal axis of at least one of the polarization reversal regions and an optical path of the laser light is 2.9° or greater and 14.6° or less.

18. The wavelength conversion laser light source according to claim 11, wherein
the wavelength conversion region of the wavelength conversion element comprises a lithium tantalite-based crystal, and
an angle made by a polarization reversal axis of at least one of the polarization reversal regions and an optical path of the laser light is 3.3° or greater and 16.6° or less.

19. An image display apparatus, comprising:
laser light sources;
a spatial modulation element; and
an optical system configured to guide light emitted from the laser light sources to the spatial modulation element, wherein
the laser light sources emit at least red, green and blue light respectively; and
at least the laser light source emitting green light among the laser light sources is the wavelength conversion laser light source according to claim 1.

20. An image display apparatus, comprising:
laser light sources;
a scanning portion configured to scan the laser light sources; and
an optical system configured to guide light emitted from the laser light sources to the scanning portion, wherein
the laser light sources emit at least red, green and blue light respectively; and
at least the laser light source which emits green light among the laser light sources is the wavelength conversion laser light source according to claim 1.

* * * * *